(12) United States Patent  
Funaya et al.

(10) Patent No.: US 8,692,135 B2  
(45) Date of Patent: Apr. 8, 2014

(54) WIRING BOARD CAPABLE OF CONTAINING FUNCTIONAL ELEMENT AND METHOD FOR MANUFACTURING SAME

(75) Inventors: Takuo Funaya, Tokyo (JP); Shintaro Yamamichi, Tokyo (JP); Daisuke Ohshima, Tokyo (JP); Yoshiki Nakashima, Tokyo (JP)

(73) Assignee: NEC Corporation, Tokyo (JP)

( * ) Notice: Subject to any disclaimer, the term of this patent is extended or adjusted under 35 U.S.C. 154(b) by 386 days.

(21) Appl. No.: 13/060,990

(22) PCT Filed: Aug. 25, 2009

(86) PCT No.: PCT/JP2009/064757  
§ 371 (c)(1),  
(2), (4) Date: Feb. 25, 2011

(87) PCT Pub. No.: WO2010/024233  
PCT Pub. Date: Mar. 4, 2010

(65) Prior Publication Data  
US 2011/0155433 A1     Jun. 30, 2011

(30) Foreign Application Priority Data  
Aug. 27, 2008  (JP) .................. 2008-218558

(51) Int. Cl.  
*H05K 1/11*   (2006.01)  
*H05K 1/18*   (2006.01)

(52) U.S. Cl.  
USPC ........... 174/264; 174/258; 174/260; 174/261; 361/761; 361/764

(58) Field of Classification Search  
USPC ......... 174/250, 256, 258, 260, 261, 262, 264, 174/267; 361/761, 764  
See application file for complete search history.

(56) References Cited

U.S. PATENT DOCUMENTS

| | | | | |
|---|---|---|---|---|
| 5,457,605 A * | 10/1995 | Wagner et al. | ................. | 361/720 |
| 5,972,482 A * | 10/1999 | Hatakeyama et al. | ......... | 428/209 |
| 6,272,015 B1 * | 8/2001 | Mangtani | ...................... | 361/707 |
| 7,692,103 B2 * | 4/2010 | Saiki et al. | ..................... | 174/262 |
| 7,796,845 B2 * | 9/2010 | Murai et al. | ..................... | 385/14 |
| 7,893,527 B2 * | 2/2011 | Shin et al. | ...................... | 257/698 |
| 8,153,909 B2 * | 4/2012 | Katagiri et al. | ................ | 174/262 |

(Continued)

FOREIGN PATENT DOCUMENTS

| JP | 5-235544 A | 9/1993 |
|---|---|---|
| JP | 2000236150 A | 8/2000 |

(Continued)

OTHER PUBLICATIONS

Taiwanese Office Action for TW098128657 dated on Mar. 28, 2013 with English Translation.

(Continued)

*Primary Examiner* — Hoa C Nguyen  
(74) *Attorney, Agent, or Firm* — Sughrue Mion, PLLC

(57) ABSTRACT

A wiring board is configured by stacking one or more conductor wiring layers and one or more insulating resin layers and comprising one or more metal vias configured to penetrate the insulating resin layer, wherein the boundary surface between the metal via and the insulating resin layer has a concavo-convex boundary cross-section structure in which the metal via and the insulating resin layer are engaged with each other.

2 Claims, 20 Drawing Sheets

(56) References Cited

U.S. PATENT DOCUMENTS

| | | |
|---|---|---|
| 2003/0169575 A1* | 9/2003 | Ikuta et al. .................... 361/761 |
| 2005/0189136 A1 | 9/2005 | Kawasaki et al. |
| 2006/0186536 A1* | 8/2006 | Hsu ............................... 257/720 |
| 2006/0223307 A1* | 10/2006 | Gotoh et al. .................. 438/640 |
| 2007/0074904 A1* | 4/2007 | Kohara et al. ................. 174/262 |
| 2007/0082183 A1* | 4/2007 | Murai et al. ................... 428/209 |
| 2007/0164349 A1* | 7/2007 | Nakasato et al. ............. 257/318 |
| 2008/0182400 A1* | 7/2008 | Machida et al. ............... 438/614 |
| 2008/0263860 A1* | 10/2008 | Mok et al. ........................ 29/847 |
| 2009/0008136 A1* | 1/2009 | Ikeguchi et al. .............. 174/255 |
| 2009/0133910 A1* | 5/2009 | Ohashi et al. ................. 174/258 |

FOREIGN PATENT DOCUMENTS

| | | | |
|---|---|---|---|
| JP | 2001332863 A | 11/2001 | |
| JP | 2001339165 A | 12/2001 | |
| JP | 2001352174 A | 12/2001 | |
| JP | 2002064178 A | 2/2002 | |
| JP | 2002084074 A | 3/2002 | |
| JP | 2002170840 A | 6/2002 | |
| JP | 2002246504 A | 8/2002 | |
| JP | 2004022999 A | 1/2004 | |
| JP | 2004288795 A | 10/2004 | |
| JP | 2005064470 A | 3/2005 | |
| JP | 2005236039 A | 9/2005 | |
| JP | 2006332346 A | 12/2006 | |
| JP | 2006339421 A | 12/2006 | |
| JP | 2008159973 A | 7/2008 | |
| TW | I252723 | 4/2006 | |
| TW | I298941 | 7/2008 | |
| WO | 2007126090 A | 11/2007 | |

OTHER PUBLICATIONS

Taiwanese Office Action for TW Application No. 098128657 dated on Oct. 29, 2013 with English Translation.

* cited by examiner

WIRING BOARD CAPABLE OF CONTAINING FUNCTIONAL ELEMENT AND METHOD FOR MANUFACTURING SAME

REFERENCE TO RELATED APPLICATION

This application is the National Phase of PCT/JP2009/064757, filed Aug. 25, 2009, which is based upon and claims the benefit of the priority of Japanese patent application No. 2008-218558 filed on Aug. 27, 2008, the disclosure of which is incorporated herein in its entirety by reference thereto.

TECHNICAL FIELD

The present invention relates to a wiring board capable of containing a functional element and method for manufacturing the same.

BACKGROUND

Regarding to the structure of a semiconductor substrate and a method for manufacturing the same, for instance, in a technology disclosed in Japanese Patent Kokai Publication No. JP-P2002-064178A (Patent Document 1), after a semiconductor device is flip-chip connected to a circuit board, such boards and other circuit boards having through vias formed by filling cavities with a conductor paste are alternately stacked, and solder balls are attached on the bottom board to obtain a semiconductor stacked package.

For instance, in Japanese Patent Kokai Publication No. JP-P2001-332863A (Patent Document 2), Japanese Patent Kokai Publication No. JP-P2001-339165A (Patent Document 3), Japanese Patent Kokai Publication No. JP-P2001-352174A (Patent Document 4), Japanese Patent Kokai Publication No. JP-P2002-084074A (Patent Document 5), Japanese Patent Kokai Publication No. JP-P2002-170840A (Patent Document 6), and Japanese Patent Kokai Publication No. JP-P2002-246504A (Patent Document 7), a through hole is formed on a core substrate, a semiconductor chip is mounted face (the active surface) up inside the hole using an adhesive, and a wiring layer is built up over an electrode terminal. Or, through vias are formed on a core substrate, and wiring layers are built up on both surfaces by a semi-additive method. Or, a semiconductor element is mounted face up on a heat sink made of metal or ceramic, and a wiring layer is built up over an electrode terminal.

For instance, in Japanese Patent Kokai Publication No. JP-P2006-339421A (Patent Document 8), after an insulating layer and a conductor layer are formed on a supporting plate by a build-up method, a semiconductor chip, on which stud bumps made of Au or solder bumps are formed, is connected face down to a conductor wiring of the supporting plate by a so-called flip-chip method via the bumps. Then the semiconductor chip is reinforced by an under-fill, and after the periphery of the connected semiconductor chip is covered with resin, a via, an insulating layer, and a conductor layer are formed by a build-up method.

For instance, in Japanese Patent Kokai Publication No. JP-P2005-236039A (Patent Document 9), patterns for positioning a semiconductor IC are formed and corresponding to the side of the chip on a transfer substrate around an area where a semiconductor IC chip is mounted, using a conductor wiring.

[Patent Document 1]
Japanese Patent Kokai Publication No. JP-P2002-064178A
[Patent Document 2]
Japanese Patent Kokai Publication No. JP-P2001-332863A
[Patent Document 3]
Japanese Patent Kokai Publication No. JP-P2001-339165A
[Patent Document 4]
Japanese Patent Kokai Publication No. JP-P2001-352174A
[Patent Document 5]
Japanese Patent Kokai Publication No. JP-P2002-084074A
[Patent Document 6]
Japanese Patent Kokai Publication No. JP-P2002-170840A
[Patent Document 7]
Japanese Patent Kokai Publication No. JP-P2002-246504A
[Patent Document 8]
Japanese Patent Kokai Publication No. JP-P2006-339421A
[Patent Document 9]
Japanese Patent Kokai Publication No. JP-P2005-236039A

SUMMARY

The entire disclosures of Patent Documents 1 to 9 are incorporated herein by reference thereto. The following analysis is given by the present invention.

A first problem is as follows. In Patent Documents 2 to 7, since a metal via is formed at a side of an embedded functional element, a via hole is formed in an area near the side of the functional element by laser or drilling. When one attempts to form a metal plating seed layer on an insulating resin surface, sputtering or electroless plating is necessary, however, it is difficult to completely cover a rough resin surface, or a protruding glass cloth or silica filler with a seed layer. A resin surface area not covered by the seed layer has weak adhesion strength even after electrolytic plating is applied, and the metal via located at the side of the function element may peel off from the insulating resin due to internal stress caused by embedding the functional element in the circuit board.

A second problem is as follows. In a case where a functional element is embedded as in the technologies disclosed in Patent Documents 1 to 7, when a circuit board made of organic resin and having no supporting plate is used underneath the mounting surface of the functional element, the organic resin portion of the circuit board is bent by the mounting weight, and the element itself may get damaged due to bending stress occurring in the element in a case where the embedded functional element is made of silicon, glass, or ceramic, resulting in a decreased yield. Further, in a case where a vacuum press or vacuum lamination method is employed when several layers of resin are stacked so as to cover the functional element in the process after the mounting, the same problem may occur if the weight is placed on the element, similarly to when the element is mounted.

A third problem is as follows. In Patent Document 9, a metal post, which later becomes a via, is formed beforehand on a side of the chip, resin is provided to areas around the chip and the metal post after the chip is mounted, and the heads of an electrode terminal on the chip and the metal post is later exposed by grinding the resin. In this case, however, it is difficult to provide resin containing a reinforcement spreading in the X-Y directions such as glass cloths, and options for resin selection will decrease. Further, since the metal post is formed by plating, the sides are flat and the post may not adhere to the resin so firmly. This may result in low adhesion strength against stress to the board such as bending caused by embedding the chip in the board.

A fourth problem is as follows. When an insulating resin layer is provided and thermally set to cover the area where a functional element is embedded as in Patent Documents 2 to 7, the surface becomes uneven and the workability and the production yield of processes thereafter, such as wiring formation and electronic parts mounting, may decrease.

The present invention has been devised in the light of these problems, and in an aspect of the present invention, it is an object to provide a wiring board resistant to stress. In another aspect of the present invention, it is an object to provide a method for processing both the formation of the wiring board and the connection of a functional element to the wiring board.

In a first aspect of the present invention, a wiring board relating to the present invention is constituted by stacking at least one conductor wiring layer and at least one insulating resin layer and includes at least one metal via penetrating the insulating resin layer; in which the insulating resin layer includes a particulate and/or fibrous reinforcing component; and a boundary surface between the metal via and the insulating resin layer has a strengthened structure in which the metal via internally engages the reinforcing component.

As the reinforcing component, known reinforcements such as silica filler, glass fiber, aramid fiber, and Aramica film can be cited, and one or a combination of these can be used.

In a second aspect of the present invention, a wiring board relating to the present invention is constituted by stacking at least one conductor wiring layer and at least one insulating resin layer and includes at least one metal via penetrating the insulating resin layer; in which a boundary surface between the metal via and the insulating resin layer has a concavo-convex boundary cross-section structure in which the metal via and the insulating resin layer are directly engaged with each other without any plating seed layer interposed therebetween.

In a third aspect of the present invention, an electronic device relating to the present invention is formed using the wiring board described above.

In a fourth aspect of the present invention, a wiring board manufacturing method relating to the present invention is a method for manufacturing a wiring board, constituted by stacking at least one conductor wiring layer and at least one insulating resin layer, including at least one metal via penetrating the insulating resin layer, the insulating resin layer includes a particulate and/or fibrous reinforcing component; and a strengthened structure in which the metal via internally engages the reinforcing component is formed on a boundary surface between the metal via and the insulating resin layer.

In a fifth aspect of the present invention, a wiring board manufacturing method relating to the present invention is a method for manufacturing a wiring board, constituted by stacking at least one conductor wiring layer and at least one insulating resin layer and including at least one metal via penetrating the insulating resin layer; and a concavo-convex boundary cross-section structure in which the metal via and the insulating resin layer are directly engaged with each other without any plating seed layer interposed therebetween is formed on a boundary surface between the metal via and the insulating resin layer.

In a sixth aspect of the present invention, a method for manufacturing a wiring board relating to the present invention includes a step of forming at least one layer each of first conductor wiring layer and insulating resin layer on a supporting plate; a step of forming a via hole in the insulating resin layer, and roughening the insulating resin of a surface inside the via hole; and a step of forming a metal via by plating in the via hole using the supporting plate as an electric supply layer.

In a seventh aspect of the present invention, a method for manufacturing a wiring board relating to the present invention includes a step of alternately forming insulating resin layers and conductor wiring layers on both surfaces of the wiring board described above as the core board; and a step of forming a metal via wiring between the conductor wiring layers.

According to the present invention, a metal via having high strength against stress caused by embedding a functional element and against external bending stress, and not directly connected to the functional element, can be formed in the wiring board capable of containing a functional element and relating. Thus, a highly reliable product can be obtained in which separation does not occur between the metal via and an insulating resin. Further, according to a wiring board manufacturing method relating to the present invention, the formation of the wiring board and the connection of the functional element to the wiring board can be performed simultaneously, and a highly reliable wiring board can be manufactured with a small number of steps.

BRIEF DESCRIPTION OF THE DRAWINGS

FIG. 1A is a schematic cross section of a type 2 metal via; and FIG. 1B is a schematic cross section of a mushroom-shaped type 2 metal via.

FIG. 2A is a schematic cross section of a type 1 via; and FIG. 2B is a schematic cross section of a type 1 via including an adhesion insulating layer.

FIG. 3A is a schematic cross section of a wiring board including a functional element; FIG. 3B is a wiring board to which electrode terminals of a functional element and a conductor wiring layer are all connected; and FIG. 3C is a wiring board in which electrode terminals of a functional element are tapered.

PREFERRED MODES

Figure 1A:
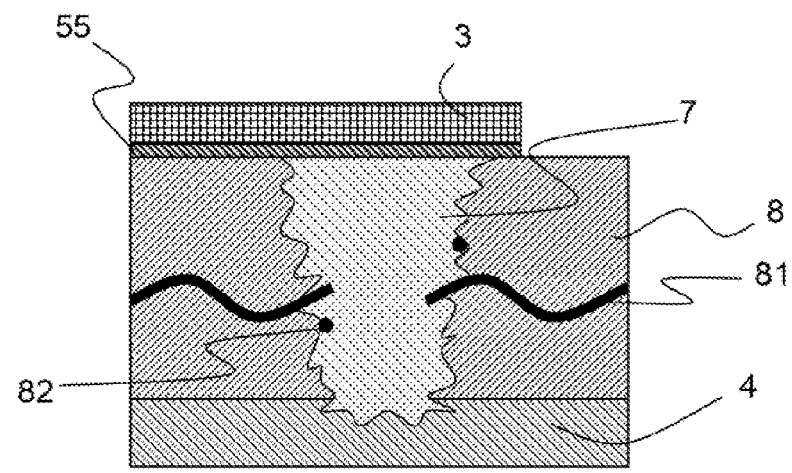
FIGS. 1A and 1B show a first example of the present invention.

It is preferable that the wiring board have the boundary surface between the insulating resin layer and the metal via roughened to have a profile having a range of 0.1 to 5 μm (difference in height between concave and convex portions).

It is preferable that a plating seed layer made of metal be not formed on the boundary surface between the insulating resin layer and the metal via.

It is preferable that at least one functional element be included inside the insulating resin layer, at least one electrode terminal be formed on a circuit surface, i.e., an active surface, of the functional element embedded, and that a first conductor wiring layer disposed nearest to the active surface of the functional element and the active surface of the functional element be wired to each other via the electrode terminal.

It is preferable that the inner diameter of the at least one electrode terminal at a portion touching the first conductor wiring layer be larger than the inner diameter of the electrode terminal at a portion touching the active surface of the functional element.

It is preferable that the electrode terminal formed on the active surface of the functional element have a plating seed layer on a boundary surface where the electrode terminal and the first conductor wiring layer are wired, and have no plating seed layer on a boundary surface between the electrode terminal and the resin layer on a side of the electrode terminal.

It is preferable that a second conductor wiring layer disposed on the outermost surface of the wiring board opposite to the active surface of the functional element be covered with the insulating resin except for a wiring surface of the second conductor wiring layer.

It is preferable that the first conductor wiring layer and the second conductor wiring layer be wired to each other via the metal via disposed away from the functional element. "The metal via disposed away from the functional element" is the via not directly connected to the functional element.

It is preferable that the metal via have no plating seed layer on a boundary surface with insulating resin in contact with a side of the metal via and on a boundary surface with the second conductor wiring layer, and have a plating seed layer on a boundary surface with the first conductor wiring layer.

It is preferable that, in an area where the metal via is wired to the first conductor wiring layer, the metal via is formed like a mushroom having a lumpshade-shaped portion the center of which is thicker than the periphery and the top of which is protruding outwardly, and be formed like a rivet having inner diameter larger on the boundary surface with the first conductor wiring layer than on the boundary surface with the second conductor wiring layer.

It is preferable that the insulating resin layer and the conductor wiring layer be alternately disposed on both surfaces of the wiring board, and that the conductor wiring layers be wired to each other via the metal via.

The resin layer may include an intermediate layer for increasing the mechanical strength of the wiring board. Further, the conductor wiring layer and the functional element may be stacked on a supporting plate made of metal or ceramic having the insulating resin layer as a basic material.

Further, as a method for manufacturing the metal via on the wiring board, the metal via may be formed after roughening a surface inside a via hole of the insulating resin layer and by electroplating, electroless plating, or by filling the hole with a conductor paste using a printing method using a conductor board as an electric supply layer. Further, mounting at least one functional element and forming an insulating resin layer around the functional element may be included. Moreover, removing the supporting plate after forming at least one second conductor wiring layer on the functional element may be included.

Further, a method for manufacturing the wiring board described above may further include flattening the top of the metal via by grinding or abrading and removing the insulating resin immediately above an electrode terminal portion of the functional element.

Further, it is preferable that, in the manufacturing method described above, the supporting plate have a releasing material layer formed therein in advance, and that the supporting plate be removed from the releasing material during manufacturing process.

Further, it is preferable that, in the manufacturing method described above, the supporting plate include at least one of the following metal elements: copper, iron, titanium, nickel, chromium, aluminum, palladium, and cobalt.

Since the outer shape of the functional element-embedded wiring board relating to the present invention is larger than that of the embedded functional element, the wiring rule of the electrode terminal of the functional element is expanded on both surfaces of the board so as to realize mounting with excellent workability and reliability in the following connecting the functional element-embedded wiring board to an electronic device.

As the functional element, a semiconductor or SAW filter or thin-film functional element having a wiring formed on Si, GaAs, $LiTaO_3$, $LiNbO_3$, or crystal, a chip part such as a condenser, resistor, and inductor, or an element having a wiring formed on a print board or flexible board can be suitably used without being limited thereto. As the supporting plate, ceramic such as silicon, glass, aluminum oxide, glass ceramic, titanium nitride and aluminum nitride, metal such as copper, stainless, iron, and nickel, and organic resin such as thick polyimide and epoxy can be suitably used without being limited thereto.

When a type 2 via formed away from the functional element (i.e., not directly connected to the functional element) is formed by plating using a conductive metal such as gold, silver, copper, and nickel, after providing a via opening in the insulating resin layer using a laser device, resin residue is removed by a desmear process and the insulating resin surface inside the via is roughened to have a profile of 0.1 to 5 μm. If the profile is not greater than 0.1 μm, the adhesion strength between the insulating resin and the via metal formed by plating will not improve. Further, if the profile is greater than 5 μm, a crack may occur between the plating metal and the insulating resin since the resin components will be destroyed and the resin surface will be fragile. Further, it becomes difficult to form a wiring having a narrow pitch in which the line width and distance between lines (line/space) of the wiring is not greater than 15 μm/15 μm.

As the method for manufacturing the metal via relating to the present invention, a method to fill a via opening with metal by electroplating using the supporting plate as an electric supply layer to make a filled via is suitably used without being limited thereto. For making a via opening, an UV-YAG or $CO_2$ laser can be suitably used without being limited thereto. Further, with a photosensitive insulating resin layer, the via opening can be formed by performing exposure and development processing.

As a method for exposing the electrode terminal of the functional element (i.e., the via directly formed on the functional element as an electrode; also called "type 1 via") and the type 2 via formed away from (and on the side of) the functional element from the insulating resin layer on the surface, the type 1 and 2 vias inside can be simultaneously exposed on the surface of the board by grinding or abrading processing.

In the present invention, the conductor wiring layer exposed on the surface is formed using copper, nickel, gold, silver, Sn—Ag solder, and so on. For instance, in a case where the conductor wiring is formed by copper plating, a seed layer can be formed by electroless plating or sputtering and the conductor wiring can be suitably formed by electroplating or by performing printing and reflow processing, however, the material for the conductor wiring surface is not limited thereto. For the via metal disposed on the side of the functional element embedded in the wiring board relating to the present invention, copper, nickel, gold, silver, and Sn—Ag can be suitably used without being limited thereto. The via metal can be formed by plating, however, it is also possible to make the metal inside the via in a solid material by providing a high temperature treatment after printing a conductor paste using a printing method.

As the electrode terminal (type 1 via) formed on the functional element, a cylindrical column called a post made of copper, nickel, gold, silver, etc., a ball made of Sn—Ag solder, and a stud bump made of Au, copper, etc. can be suitably used without being limited thereto.

Further, on the outermost surface of the wiring board relating to the present invention capable of containing a functional element, a solder resist layer having openings only in necessary areas can be suitably formed in order to limit the area of the conductor wiring exposed on the surface for preventing oxidation of the conductor wiring and a short circuit between the conductor wirings during the mounting using solder. Further, a conductor wiring resistant against oxidation and having excellent solderability can be formed by performing electroless plating, electroplating, or printing processing on the conductor wiring exposed in these openings, using copper, nickel, gold, silver, or Sn—Ag solder.

Further, a build-up method can be applied to the wiring board relating to the present invention in order to create a multilayer wiring by alternately forming insulating layers and conductor wiring layers on both surfaces and wiring the conductor wiring layers using a via. Such a multilayer wiring board, an electronic component in which a diced piece of a wiring board is mounted on another circuit board or a functional element and a board further containing the functional element-embedded wiring board fall within the scope of the present invention as well.

EXAMPLES

Examples of the present invention will be described below with reference to the drawings.

Example 1

Figure 1B:
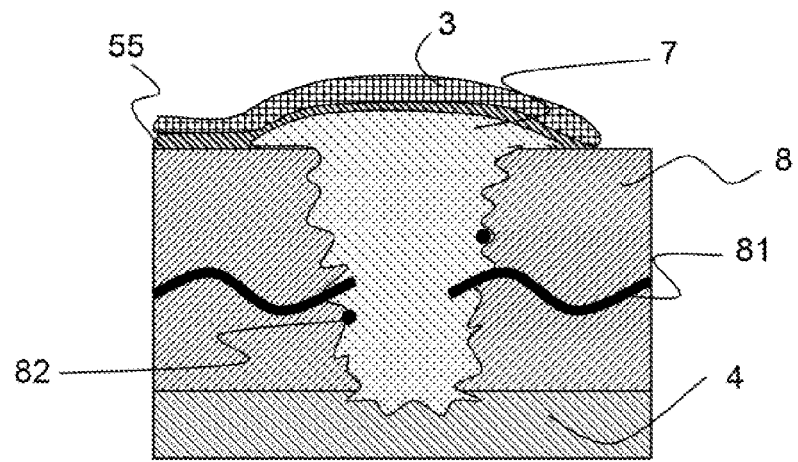

FIGS. 1A and 1B show a first example of the present invention. FIGS. 1A and 1B show the cross-sectional structure of a type 2 metal via 7 (i.e., a via that is not a functional element electrode) disposed in a wiring board relating to the present invention. In FIG. 1A, the upper surface of the metal via 7 formed by electroplating and made of copper has a flatness deviation of not greater than plus or minus 10 μm, is on the same plane as the upper surface of an insulating resin layer 8 with a height error (difference) of not greater than plus or minus 5 μm, and is wired to a (first) conductor wiring layer 3 via a (plating) seed layer 55. The seed layer 55 was created by sequentially forming a Ti layer with a thickness of 30 to 200 nm and a Cu layer with a thickness of 200 to 400 nm, using a sputtering device. Further, a (second) conductor wiring layer 4 is wired to the metal via 7 from underneath, and there is no seed layer between the metal via 7 and the conductor wiring layer 4. Through a temperature cycle test, high-temperature/high-humidity test, and bending test, it has been confirmed that the connection area between the metal via 7 and the conductor wiring layer 4 maintains excellent reliability since there is no boundary with other materials.

An interface in contact with the insulating resin layer 8 at a side of the metal via 7 has its resin surface roughened to have a profile of 0.1 to 5 μm (difference in height between concave and convex portions) so that the via metal penetrates into the fine concave and convex portions formed on the resin surface, and therefore excellent adhesion strength can be achieved. The adhesion strength is sufficiently strong because of this, however, as shown in FIG. 1, when insulating resin containing a reinforcement is used, since the metal via 7 is formed further enfolding the inorganic reinforcement such as a glass cloth 81 and a silica filler 82 contained in the insulating resin, the metal via 7 and the insulating resin are joined even more closely. As a result, it becomes possible to maintain even more excellent adhesion strength and to obtain a highly reliable wiring board resistant to deformation in three-dimensional directions.

In FIG. 1B, the center of the upper surface of the metal via 7 is shaped like a mushroom, a thickness from the top end of the metal via 7 is not smaller than 10 μm, and the cap (lump-shaped portion) of the mushroom is larger than an opening of the insulating resin layer 8 by approximately 0.1 to 10 μm. The conductor wiring layer 3 is formed over the plating seed layer 55 on the top of this mushroom-shaped structure. Since the cap of the mushroom functions as a rivet of the metal via 7 formed in the insulating resin layer 8, it has been confirmed that excellent reliability against bending in the Z-axis direction can be obtained, by a temperature cycle test at a temperature of −55 to 125 degrees Celsius. As in FIG. 1A, the conductor wiring layer 4 is wired to the metal via 7 from underneath, and there is no seed layer between the metal via 7 and the conductor wiring layer 4. Further, the characteristics of an interface in contact with the insulating resin layer 8 at a side of the metal via 7 are the same as described regarding FIG. 1A.

In the case where the type 2 metal via is shaped like a mushroom, although the mushroom-shaped part protrudes, other areas on the surface of the functional element-embedded board are flat. In this case, reliability against bending in the Z-axis direction can be increased, and a high density multilayer wiring can be formed by a build-up method by having the height of the mushroom-shaped part not greater than the height of the insulating resin layer provided above.

As shown in FIGS. 1A and 1B, there is no plating seed layer on the boundary surface between the metal via 7 and the insulating resin layer 8. As a result, since voids likely to occur when the plating seed layer is provided as in the conventional technologies do not arise, a highly reliable structure with few structural defects can be obtained. This structure can be suitably manufactured by a manufacturing method described later.

Example 2

Figure 2A:
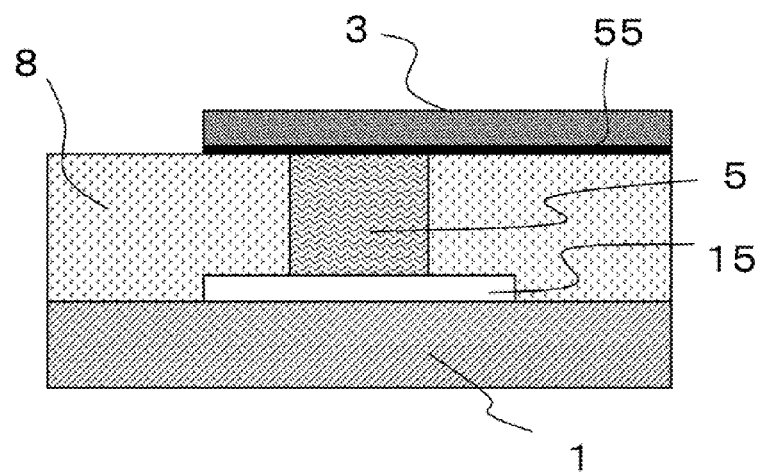
FIGS. 2A and 2B show a second example of the present invention.
Figure 2B:
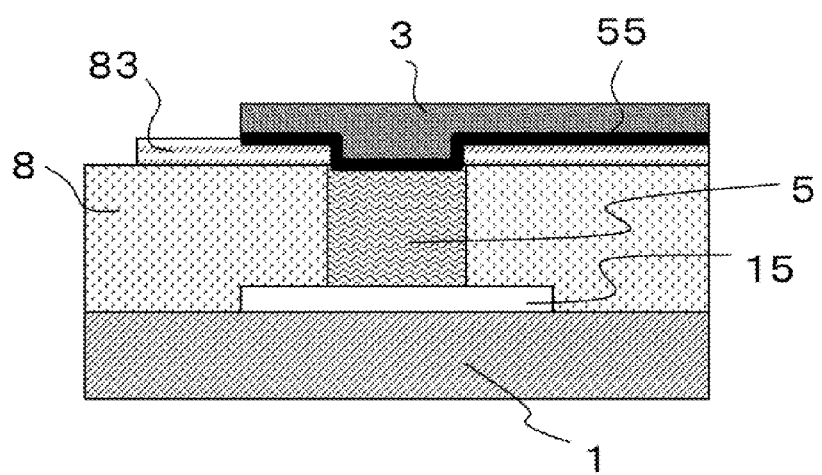

FIGS. 2A and 2B show a second example. FIG. 2A show a structural cross section of a wiring board relating to the present invention in which an electrode terminal 5 formed above an electrode pad 15 of a functional element 1 embedded in the insulating resin layer 8 and the conductor wiring layer 3 are wired to each other with a (plating) seed layer 55 interposed therebetween. As the insulating resin layer 8, a commercially available prepreg, such as "ABF-GX" manufactured by Ajinomoto Fine-Techno Co., Inc. or "GEA-679FG" manufactured by Hitachi Chemical Co., Ltd, is used. Further, it was possible to form it using "PIMEL" manufactured by Hitachi Chemical Co., Ltd, "V-259PA" (the product name) manufactured by Nippon Steel Chemical Co., Ltd., or "SUMIRESIN CRC-8300" (the product name) manufactured by Sumitomo Bakelite Co., Ltd., which are in liquid state before thermosetting.

The electrode terminal 5 was formed by copper plating, having a height of 5 μm to 50 μm. The plating seed layer 55 is disposed between the bottom of the conductor wiring layer 3 and the top of the insulating resin layer 8, and the plating seed layer 55 also lies between the electrode terminal 5 and the conductor wiring layer 3 on the same surface. The seed layer 55 was created by sequentially forming a Ti layer with a thickness of 30 to 200 nm and a Cu layer with a thickness of 200 to 400 nm from the insulating resin layer 8 to the bottom of the conductor wiring layer 3, using a sputtering device. Similarly, it was possible to create the seed layer 55 by sequentially forming combinations of a Cr layer and a Cu layer, a Pd layer and a Cu layer, or a Ti layer and a Cu layer by sputtering processing. Further, the seed layer 55 can be formed using electroless Cu plating, and in this case, since displacement plating is performed, a certain amount of Pd and Sn will be included.

The upper surface of the insulating resin layer 8 and the upper surface of the electrode terminal 5, both in contact with the seed layer 55, should be on the same plane with a height error (difference) of not greater than plus or minus 5 μm. By having such a structure, the electrode terminal 5 and the conductor wiring layer 3 are connected on a plane having few displacement points, and high product reliability can be obtained. Further, during the formation process of the conductor wiring layer 3, the wiring is formed in a state in which the exposed area of the electrode terminal 5 and the surface of the insulating resin layer 8 are on the same plane, this facilitates the exposure and development of a plating resist pattern, and it is possible to wire the conductor wiring layer 3 to the electrode terminal 5 with high positional accuracy.

Since the surfaces of the insulating resin layer 8 and the exposed surface of the electrode terminal 5 are roughened by desmear process normally using such as $KMnO_4$ or $NaMnO_4$ before the seed layer 55 is formed, the surfaces normally have a roughness of not greater than approximately 10 μm. By this roughening processing, it becomes possible to increase the adhesion strength among the insulating resin layer 8, the seed layer 55, and the conductor wiring layer 3 and to increase the reliability of the product.

The conductor wiring layer 3 was created by forming a Cu layer with a thickness of 5 to 25 μm. When an inactive metal is required, Au was used. Further, in the case where the wiring is formed with Cu, the layer can be used without any further processing, but electroless plating processing was performed on the surface using Ni and Au as an antioxidant. In order to surface-mount components, Sn, Sn—Ag, and Sn—Ag—Cu solder is provided on the surface of the conductor wiring layer 3 by paste printing and reflow processing. After the conductor wiring layer 3 has been formed, extra areas of the seed layer 55 were removed by chemical etching using a chemical or mechanically etching using IBE (Ion Beam Etching) to use the conductor wiring layer 3 as a circuit.

FIG. 2B shows a structure in which an insulating resin layer 83 having high adhesion strength to seed layers is formed on the insulating resin layer 8 in order to increase the adhesion strength between the insulating resin layer 8 and the seed layer 55 in FIG. 2A. When the insulating resin layer 83 is used, in order to keep the ground opening that exposes the electrode terminal 5, it is preferable that the insulating resin layer 83 have high workability with $CO_2$ or UV-YAG laser, or it be made of photosensitive-type resin.

On the insulating resin layer 83, the seed layer 55 was formed by sequentially sputtering Cr and Cu layers or Ti and Cu layers, as in FIG. 2A. By having the opening diameter of the insulating resin layer 83 smaller than the diameter of the electrode terminal 5, it became possible to increase the number of wirings normally connected between the electrode terminals 5 and to reduce the volume of the board as a whole.

Example 3

Figure 3A:
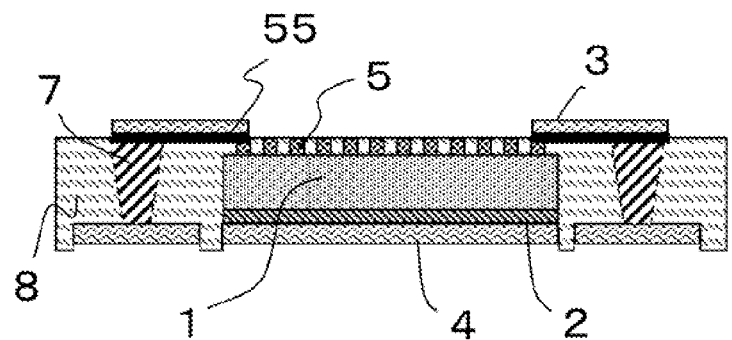
FIGS. 3A, 3B, and 3C show a third example of the present invention.
Figure 3B:
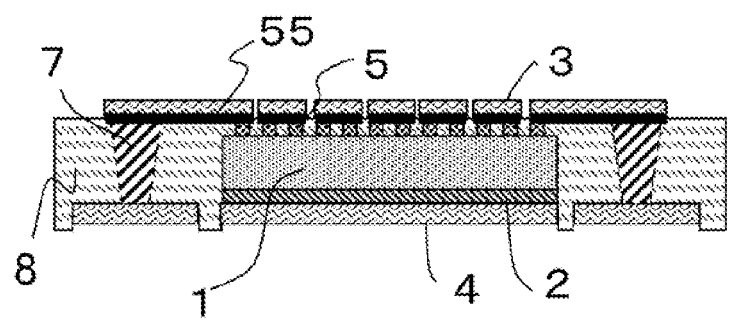
Figure 3C:
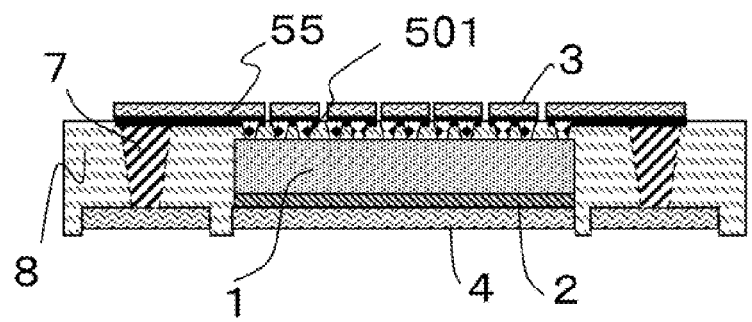

FIGS. 3A, 3B, and 3C show a third example of the wiring board relating to the present invention. FIGS. 3A, 3B, and 3C show structural cross sections of the wiring board relating to the present invention in which the functional element 1 is embedded in the insulating resin layer 8 as a base material. Above and beneath the functional element 1 made of GaAs and silicon, one layer each of the first conductor wiring layer 3 and the second conductor wiring layer 4 having a thickness of 1 to 20 μm are formed by copper plating. The electrode terminal 5, made of copper, of the functional element 1 and the conductor wiring layer 3 are wired by the same manner as shown in FIG. 2A or 2B. The metal via 7 and the conductor wiring layer 3 are wired as shown in FIGS. 1A and 1B, and the metal via 7 and the insulating resin layer 8 are adhered to each other as shown in FIGS. 1A and 1B. The conductor wiring layer 4 on the side opposite to the side of the electrode terminal of the board 1 is buried in the surface of the insulating resin layer 8 by 0 to 20 μm (i.e., the surface of the conductor wiring layer 4 is lower than that of the insulating resin layer 8), the sides of the conductor wiring layer 4 are covered with the insulating resin layer 8, and the outer surface of the conductor wiring layer 4 is not covered with the insulating resin layer 8.

In FIG. 3A, only some of the electrode terminals 5 are wired to the conductor wiring layer 3, and in this case, it is possible to directly connect the embedded functional element 1 and another functional element via the electrode terminals 5. Especially, when another device is a chip having an electrode terminal at the same pitch as the electrode terminal 5 of the functional element 1, it is possible to flip-chip connect the active surfaces of the functional element 1 and the device using Sn—Ag lead-free solder. As a result, reliable signal transmission between two functional elements at a transmission speed not slower than 5 GHz becomes possible.

In FIG. 3B, all the electrode terminals 5 are wired to the conductor wiring layer 3, and in this case, it is possible to connect the embedded functional element 1 and another functional element with expanded/reduced wiring pitches by rearranged electrode terminals in a wiring circuit on the conductor wiring layer 3. In the present technology, reliable and high-speed signal transmission between two functional elements at a transmission speed not slower than 5 GHz becomes possible by expanding the pitch of the electrode terminal 5, having a pitch of 50 μm, of the functional element 1 to form electrode pads having a pitch of 100 μm using the conductor wiring layer 3 and connecting the functional element 1 to another device with an electrode terminal having a pitch of 100 μm.

In the case of FIG. 3C, electrode terminals 501 of the functional element 1 are tapered in the same direction as the type 2 metal vias 7 disposed at the sides of the functional element 1. Since the electrode terminal 501 is tapered and formed as if being wedged into the insulating resin layer 8 disposed between the conductor wiring layer 3 and the functional element 1, the thermal expansion of the resin does not cause the electrode terminal 501 to peel off from the insulating resin layer 8 and it becomes possible to increase the reliability of the product. Further, it is also possible to increase the adhesion strength between the metal of the electrode terminal 501 and the insulating resin layer 8 by forming a fine concavo-convex pattern having a profile of 0.1 to 5 μm on the sides of the electrode terminal 501 as in FIG. 1, and the reliability can be further increased.

In FIGS. 3A, 3B, and 3C, on the surface opposite to the electrode terminals 5 or 501 of the functional element 1, the functional element 1 and the conductor wiring layer 4 are connected by an adhesion layer 2, made of semi-cured resin, called die attachment film. As a result, when the functional element 1 generates heat, the heat can be released through the conductor wiring layer 4 and the reliability of the product can be improved.

It was confirmed that more efficient heat dissipating effects can be obtained by forming a wiring pattern the shape of which is close to the outer shape of the surface opposite to the electrode terminal 5 or a pattern (8.5 mm by 8.5 mm) larger than the outer shape of the functional element 1 on the area of the conductor wiring layer 4, on which the functional element is directly mounted, when the outer area of the functional element 1 is 8 mm by 8 mm. This also protects the functional element 1 from impact from the outside of the board, and highly reliable circuit board structure can be built. It was also confirmed that the effect that protects the functional element 1 increases when the thickness of the functional element is not larger than 200 μm, mitigating local concentration of stress on the functional element 1 caused by bending of the board and protecting the functional element 1 from being damaged, such as being cracked.

As described, it becomes possible to improve the reliability of the product since the wiring pattern for releasing heat from the board, in which the functional element is embedded, is provided in order to release the heat generated by the functional element, and the heat releasing pattern can be freely designed so as to mitigate the stress caused by the difference in thermal expansion coefficient and occurring between the wiring materials of the board and the functional element.

Since the conductor wiring layer 4 forms the pattern and areas exposing the insulating resin layer 8 are provided in more appropriate places, compared with a package in which a large-area single-piece metal such as a normal heat sink is attached to the back of a functional element chip, it was confirmed that it was easy to mitigate the stress occurring between the functional element and the conductor wiring layer 4 caused by the difference in thermal expansion coefficients between these materials, and a highly reliable product having a long life could be produced by using the board containing a functional element according to the present invention as a semiconductor package.

The conductor wiring layers 3 and 4 can be suitably formed with one or more materials such as copper, nickel, gold, silver, and lead-free solder alloy, by plating or using a printing method, without being limited thereto.

As for the insulating resin layer 8, a material based on epoxy, polyimide, liquid crystal polymer, etc. is suitably used without being limited thereto. Further, for the purposes of increasing the strength and improving the high-speed transmission performance, aramid non-woven fabric, aramid film, glass cloth, and silica film can be suitably contained inside the insulating resin layer 8, however, the material contained in the insulating resin is not limited thereto. Further, these insulating resin layers 8 can interlock with the metal vias 7 at the boundary surfaces and have excellent reliability against stress such as board bending. In the present example, epoxy-based materials containing glass cloth inside, containing aramid non-woven fabric, and using an aramid film were used for the insulating resin layer 8. Further, it was confirmed that polyimide can be used as well.

It was confirmed that any of the following products could be used as a die attachment film: "LE-4000" (the product name) and "LE-5000" (the product name) manufactured by Lintec Corporation, and "DF402" (the product name) manufactured by Hitachi Chemical Co., Ltd. By directly mounting electronic parts on the conductor wiring layer 3 provided immediately above the functional element 1, thereby making the distances between these electronic parts and the electrode terminals 5 of the functional element 1 short, it became possible to obtain excellent high-speed electrical characteristics.

By directly mounting electronic parts on the conductor wiring layer 3 provided immediately above the functional element 1, thereby making the distances between these electronic parts and the electrode terminals 5 of the functional element 1 short, it becomes possible to obtain excellent high-speed electric characteristics. The insulating resin layer 8 can be created with one type of resin and used as the basic material of the board containing a functional element, however, since the number of resin layers and the type of resin are not restricted in the present invention, the insulating resin layer 8 can be formed by stacking resin layers. Since different resin layers are stacked, by using soft resin resistant against external bending stress and cracks for the resin layers close to the surface of the board and using an insulating resin having a thermal expansion coefficient that is close to that of the functional element 1 for an insulating resin layer close to the functional element 1, a crack occurring between the resin and the functional element can be minimized and the reliability can be increased.

Example 4

Figure 4:
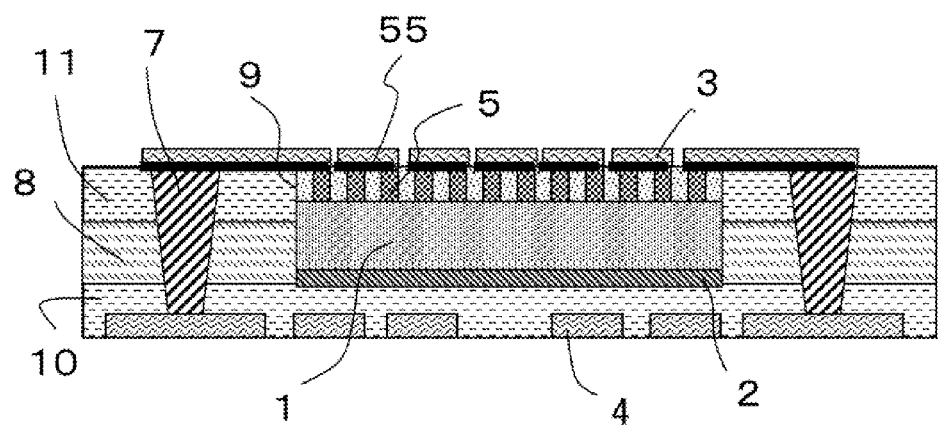
FIG. 4 shows a schematic cross section of a wiring board relating to Example 4 of the present invention.

FIG. 4 shows a fourth example of the present invention. It shows a circuit board structure having organic insulating resin layers 8, 10 and 11 (the thickness of each layer is 10 to 500 μm) as the basic materials and a functional element embedded. Above and below the functional element 1 made of silicon, glass, and polyimide as the basic materials and having a resistor, capacitor, and inductor circuits formed thereon using a vapor deposited thin film, one layer each of the conductor wiring layers 3 and 4 made of copper is formed. The electrode terminal 5 of the functional element 1, whose uppermost surface is made of copper, and the conductor wiring layer 3 are wired via the seed layer 55 as shown in FIG. 2A or 2B. Further, the metal via 7 and the conductor wiring layer 3 are wired as shown in FIGS. 1A and 1B, and the sides of the metal via 7 and the insulating resin layer 8 are attached to each other as shown in FIGS. 1A and 1B. The surface of the functional element 1 opposite to the side where the electrode terminals 5 are arranged is joined to the insulating resin layer 10 provided immediately above the conductor wiring layer 4 via the adhesion layer 2 made of epoxy. The conductor wiring layer 4 is entirely covered with the insulating resin layer 10 except for its external surface and has a wiring formed inward from the surface of the insulating resin layer 10.

The conductor wiring layers 3 and 4 above and below are wired to each other via the metal via 7 having the inside of the via filled with copper plating or a conductor paste including Sn—Ag powder. In the present invention, it is unnecessary to restrict the number and the type of insulating resin layers, three layers are used: the insulating resin layers 8, 10, and 11. Since the insulating resin layer is divided into different layers, by using soft resin such as polyimide resin or epoxy resin resistant against external bending stress and cracks for the insulating resin layers 10 and 11 close to the surface of the board and using an organic resin containing glass cloth, glass filler, aramid non-woven fabric, or aramid film for the insulating resin layer 8 close to the functional element 1 thereby making sure that the thermal expansion coefficient of the insulating resin layer 8 is close to that of the functional element 1, a crack occurring between the resin and the functional element can be minimized and the reliability can be increased.

By dividing the insulating resin layer into several different layers, types of resin having high heat resistance and low heat resistance, and costly and inexpensive types of resin can be used in combination; therefore it is possible to improve product reliability while reducing costs. The thicknesses of the organic insulating resin layers 8, 10, and 11 may be changed according to the thickness of the functional element embedded. When an insulating layer such as an insulating resin layer 9 is provided at the periphery of the electrode terminal of the functional element in advance, a type of resin that attaches to the insulating resin layer 9 well may be selected as the insulating resin layer 11. The number of resin layers is not limited to three, and numerous resin layers can be stacked during the manufacturing process.

An effect of the present structure different from the structure in FIG. 3B is that, when the embedded functional element 1 has a low heat generation during operation, two conductor wiring patterns, the conductor wiring layers 3 and 4, can be formed on the surfaces of the board immediately above and below the functional element 1 by providing the insulating resin layer 10 between the adhesion layer 2 and the conductor wiring layer 4. Electronic parts can be surface-mounted on and semiconductor device can be flip-chip connected to the exposed conductor wiring patterns on the surfaces of the board containing a functional element according to the present invention. As a result, the board area can be effectively used for mounting parts, and it is possible to reduce the area of the board and the size of the product.

Example 5

Figure 5:
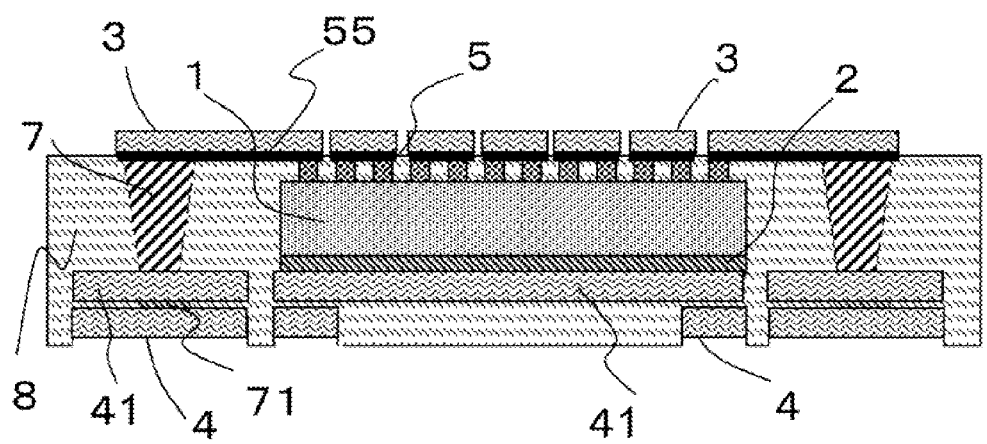
FIG. 5 shows a schematic cross section of a wiring board relating to Example 5 of the present invention.

FIG. 5 is a fifth example of the present invention and shows a circuit board structure in which the functional element 1 having the organic insulating resin layer 8 as the basic material is embedded. Above the functional element 1, a layer of the conductor wiring layer 3, made of copper, having a thickness of 10 μm is formed, and two layers of conductor wiring layers 41 and 4, both made of copper and having a thickness of 10 μm, are formed below the functional element 1. The electrode terminal 5 of the functional element 1, basically made of silicon substrate, and the conductor wiring layer 3 are wired to each other via the seed layer 55. The surface of the functional element 1 opposite to the side where the electrode terminals 5 are arranged is joined to the conductor wiring layer 41 provided immediately above the conductor wiring layer 4 via the adhesion layer 2. The conductor wiring layers 3 and 41 are wired to each other via the metal vias 7 made of copper and disposed at the sides of the functional element 1, and the conductor wiring layers 41 and 4 are wired to each other via a conductor via 71 made of copper. Further, the height of the conductor wiring layer 4 is shorter than that of the insulating resin layer 8, and although the sides of the conductor wiring layer 4 touches the insulating resin layer 8, the surface of the conductor wiring layer 4 is not covered by the insulating resin layer 8.

In the present invention, the number of conductor wiring layers above and below the functional element 1 can be freely set. By providing the conductor wiring layer 41 immediately above the conductor wiring layer 4, it becomes possible to obtain desirable electrical characteristics since the flexibility for designing the ground is increased. Moreover, by using the copper wiring in larger areas, desirable heat dissipation can be obtained. Further, when a circuit pattern is provided in an area of the conductor wiring layer 4, made of copper, immediately below the functional element, the functional element chip can be mounted more desirably by forming a flat pattern larger than the outer area of the functional element on a functional element mounting area of the conductor wiring layer 41.

Example 6

Figure 6:
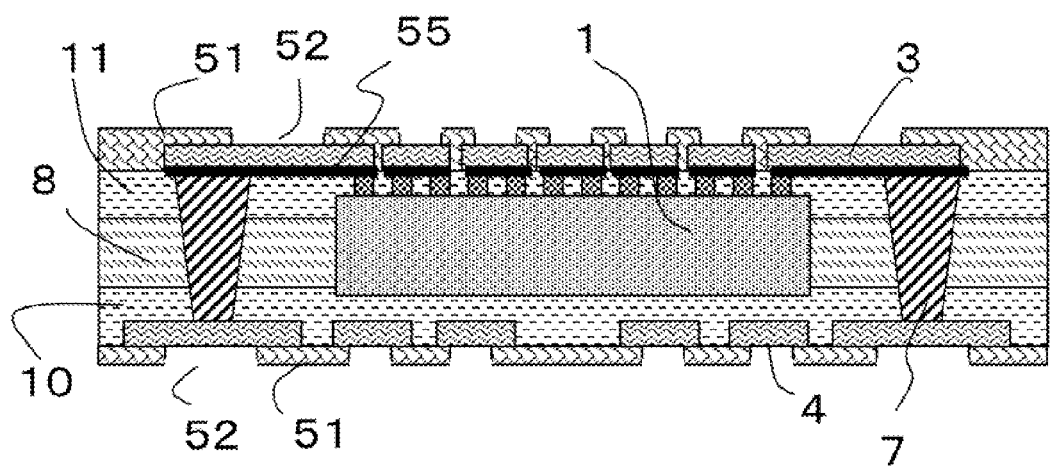
FIG. 6 shows a schematic cross section of a wiring board, on which a solder resist is formed, relating to Example 6 of the present invention.

FIGS. 6, 7, 8, and 9 show a sixth example of the present invention. FIG. 6 shows a structure in which solder resist layers 51 are formed on both sides of the board containing the functional element 1 and having the organic insulating resin layers 8, 10, and 11 as the basic materials. Above and below the functional element 1, the conductor wiring layers 3 and 4 are formed respectively, and the electrode terminal 5 of the functional element and the conductor wiring layer 3 are wired to each other via the seed layer 55 as shown in FIG. 2A or 2B. The metal via 7 and the conductor wiring layer 3 are wired as shown in FIG. 1A or 1B, and the metal via 7 is attached closely to the insulating resin layer 8 at the boundary surface as shown in FIGS. 1A and 1B. The conductor wiring layers 3 and 4 above and below are wired to each other via the metal via 7 having the inside of the via filled with metal or a conductor paste. The surface of the functional element 1 opposite to the side where the electrode terminals 5 are arranged is joined to the insulating resin layer 10 provided immediately above the conductor wiring layer 4. Further, the height of the conductor wiring layer 4 is lower than the surface of the insulating resin layer 10, and although each side of the conductor wiring layer 4 is covered with the insulating resin layer 10, the surface of the conductor wiring layer 4 is not covered with the insulating resin layer 10.

Figure 7:
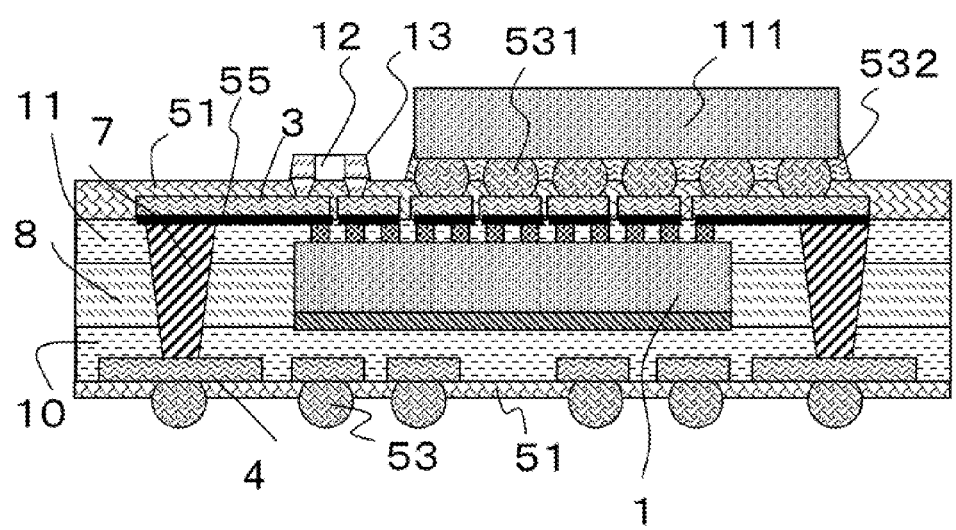
FIG. 7 shows a schematic cross section of a wiring board, on which a functional element is mounted, relating to Example 6 of the present invention.

The solder resist is provided using a printing method or spin-coating method when a liquid solder resist is used. When a dry film solder resist is used, it is provided using a lamination method. Then, by performing exposure and development processing and main curing processing, solder resists having a thickness of 2 to 50 mm and necessary openings 52 were formed. After mounting solder balls 53 in these openings 52 as shown in FIG. 7, the board could be used as a ball grid array (BGA) package.

Figure 8:
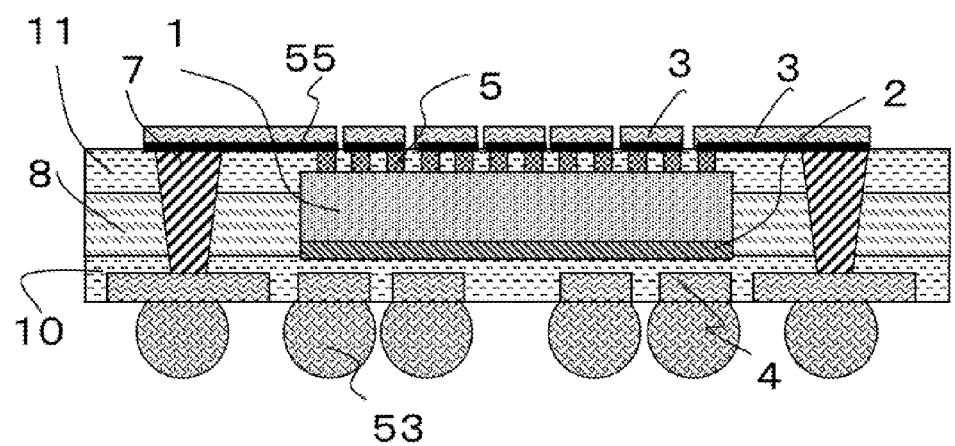
FIG. 8 shows a schematic cross section of the wiring board relating to Example 6 of the present invention without a solder resist.

As shown in FIG. 3B, since the board surface of the conductor wiring layer 4 has the conductor wiring surface disposed at the same level as or a lower level than the surface of the insulating resin layer 10, the solder balls 53 can be formed directly on it without the solder resist layer 51 as shown in FIG. 8. In this case, because the solder resist layer is not formed, costs can be reduced and a crack occurring between the solder resist and the insulating resin layer 10 can be minimized. However, as shown in FIG. 7, it is preferable to provide the solder resist layer having only the electrode terminal areas exposed on the surface where the conductor wiring layer 3 is provided in order to prevent a short circuit between conductor wirings caused by melting of lead-free solder 13 during reflow processing when an electronic part 12 is surface-mounted, or melting of solder balls 531 of a functional element 111 such as a wireless element or a second LSI. Because of this, to avoid the board warpage caused by thinness of the board, it is preferable to provide the solder resist layer 51 on the surface of the conductor wiring layer 4 as well in order to maintain the structural symmetry of both sides of the board.

Figure 9:
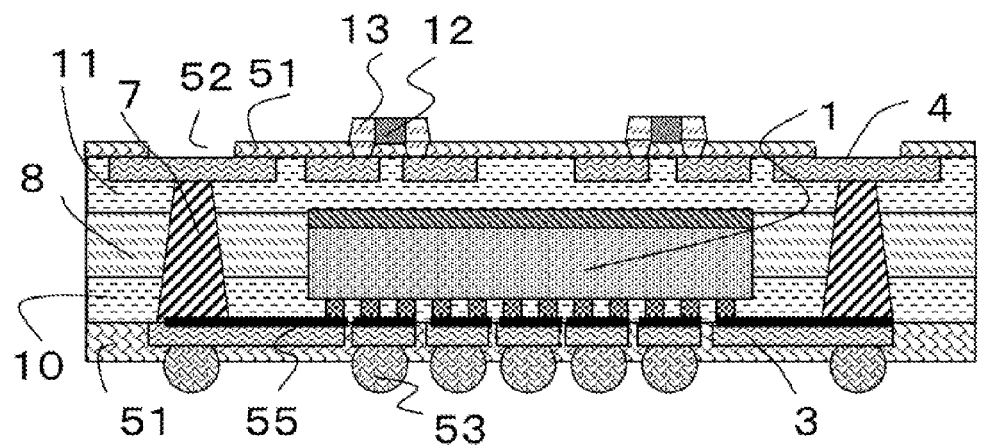
FIG. 9 shows a schematic cross section of the wiring board, on which solder balls are provided on a surface opposite to the case in FIG. 8, relating to Example 6 of the present invention.

As shown in FIG. 9, the solder balls 53 may be formed on the surface on the side of the electrode terminal 5 of the functional element 1, the opposite case to FIG. 8. In this case, the wiring length between the electrode terminal 5 of the embedded functional element 1 and a circuit board such as a motherboard wired to this package via the solder balls 53 can be shortened, and it becomes possible to obtain a product having excellent high-speed electrical characteristics. Compared to FIG. 3B in which one type of resin is used for the insulating resin layer 8 as the basic material of the board containing a functional element, in the structures shown in FIGS. 6, 7, 8, and 9, the three resin layers 8, 10, and 11 are used since the number and type of resin are not restricted in the present invention.

Since the resin layer is divided into different layers, by using soft resin having a thermal expansion coefficient of approximately 60 ppm/K resistant against external bending stress and cracks for the resin layers 10 and 11 close to the surface of the board and using resin having a thermal expansion coefficient of approximately 30 ppm/K and containing silica filler and glass cloth for the insulating resin layer 8 close to the functional element 1 thereby making sure that the thermal expansion coefficient of the insulating resin layer 8 is close to that of the functional element 1, a crack occurring between the resin and the functional element can be minimized and the reliability in temperature cycle test and bending test can be increased.

By dividing the resin layer into several different layers, polyimide resin having a high heat resistance of equal to or greater than 200 degrees Celsius and epoxy resin having a low heat resistance of equal to or less than 180 degrees Celsius, and costly and inexpensive types of resin can be used in combination; therefore it is possible to improve product reliability while reducing costs. The thicknesses of the organic resin layers 8, 10, and 11 may be changed according to the thickness of the functional element embedded. The number of resin layers is not limited to three.

As shown in FIG. 6, the insulating resin layer 10 can be used as an adhesive for securing the back of the functional element 1. This could be realized by temporarily curing the insulating resin layer 10 after it was provided using a lamination method thereby maintaining its shape, and mounting the functional element 1 on the top of it.

An effect of the structures in FIGS. 6, 7, 8, and 9 different from the structure in FIG. 3B is that, when the embedded functional element 1 has a low heat generation during operation, conductor wiring patterns can be formed on both surfaces of the board immediately above and below the functional element 1 by providing the insulating resin layer 10 between the adhesion layer 2 and the conductor wiring layer 4. Since these wiring patterns are connected via the metal via 7, such circuit boards can be stacked vertically, making it possible to form high-density mounted body.

Since all of the vias are formed by laser processing from above the electrode terminal 5 of the functional element 1, all the vias are tapered in the same direction (the relative relations between length of the inner diameters of the bottom and the top of the vias are the same) and are disposed such that the inner diameter becomes smaller towards the board surface of the conductor wiring layer 4 and the inner diameter becomes larger towards the opposite surface of the board where the conductor wiring layer 3 is provided. During formation of the via, the inner diameter of the peripheral resin of the via may partially swell by approximately 10 μm at the bottom of the metal via 7 due to heating by laser application. Since the vias are tapered in the same direction, during the process in which metal plating is applied to the inside of the vias, it is easy to observe the plating area and distinguish between desirable and undesirable plating areas, making it possible to improve the quality of the product.

As for the metal via 7, when the ratio of the height against the inner diameter of the top of the metal via 7 is larger than 1:1, metal particles inside the via can be integrated by filling it with a lead-free solder paste or conductor paste using a printing method and applying a heat treatment. Electronic parts can be surface-mounted on and semiconductor device can be flip-chip connected to the conductor wiring patterns on both surfaces of the board, and the board area can be effectively used for mounting parts, making it possible to reduce the area of the board and the size of the product.

Example 7

Figure 10:
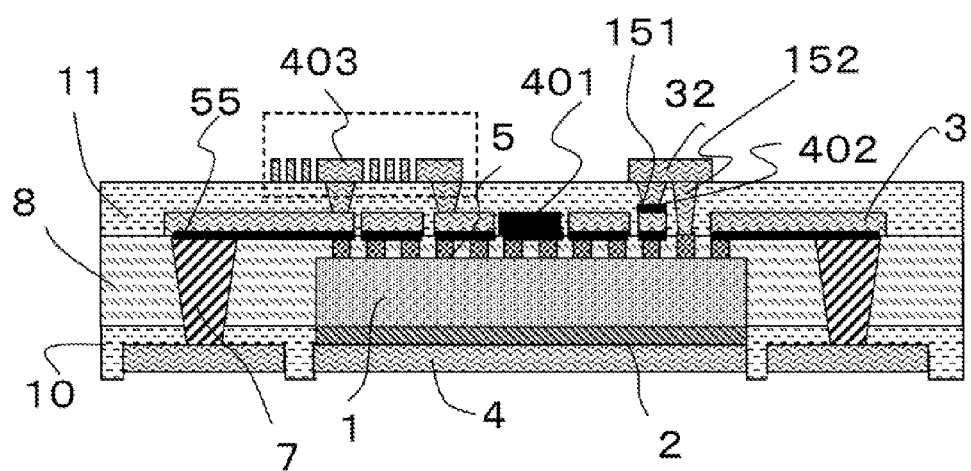
FIG. 10 shows a schematic cross section of a wiring board, on which a resistor and other parts are mounted, relating to Example 7 of the present invention.

FIG. 10 shows a seventh example of the present invention. FIG. 10 shows a wiring board structure having the organic resin layers 8, 10, and 11 as the basic materials and containing the functional element 1. Above and below the functional element 1 made of GaAs and having a thickness of 20 μm, one layer each of the conductor wiring layer 3 and the conductor wiring layer 4 are formed. The electrode terminal 5 of the functional element 1 and the conductor wiring layer 3 are wired via the seed layer 55 formed by sequentially sputtering Ti and Cu layers. The metal via 7 and the conductor wiring layer 3 are wired as shown in FIG. 1A or 1B, and the boundary surfaces of the metal via 7 and the insulating resin layer 8 are wired as shown in FIG. 1A or 1B as well. The conductor wiring layers 3 and 4 above and below are wired to each other via the metal via 7 having the inside of the via filled with metal or a conductor paste. The surface of the functional element 1 opposite to the side where the electrode terminals 5 are arranged is joined to the conductor wiring layer 4 via the adhesion layer 2. The height of the conductor wiring layer 4 is lower than the surface of the insulating resin layer 8 by approximately 5 μm, and although the sides of the conductor wiring layer 4 are covered with the insulating resin layer 8, the surface of the conductor wiring layer 4 is not covered by the insulating resin layer 8. Further, a conductor wiring layer 32 is disposed above the conductor wiring layer 3, and the conductor wiring layer 32 is connected to the conductor wiring layer 3 via a conductor via 151.

FIG. 10 shows a wiring board structure in which a resistor 401 is formed with titanium nitride or titanium oxide, a dielectric 402 is formed with tantalum oxide or strontium titanium oxide, and a spiral-shaped or meander-shaped inductor 403 is included in parts of the conductor wiring layer 3 and the conductor wiring layer 32 disposed above the conductor wiring layer 3 of the board containing a functional element.

Not specific to Example 7, a resistor including one or more following elements: Cu, W, Cr, Pt, Ni, Zn, Fe, Al, C, Mn, Ir, Ti, N, and O can be provided, and a dielectric including one or more following elements: Mg, Ti, Sr, Ba, Ca, Zn, Al, Ta, Si, Au, N, and O can be provided in parts of the conductor wiring layer 3 and the conductor wiring layer 32 disposed above the conductor wiring layer 3 of the board containing a functional element, and the functional element 1 including a spiral-shaped or meander-shaped inductor can be embedded.

In the present invention, a seed layer different from the seed layer 55 may be provided at the bottom of a conductor via 152 wiring the conductor wiring layer 32 and the electrode terminal 5 of the functional element 1. Further, these resistor, dielectric, and inductor may be formed on the surface opposite to the electrode terminal 5 of the functional element 1. In the present invention, by including at least one of the resistor, dielectric, and inductor, it becomes possible to reduce the volume of passive elements embedded in or surface-mounted on the board and obtain excellent electrical characteristics. Further, forming an inductor on an LSI is difficult since it decreases the Q value, however, it is easy to form it in the board containing a functional element according to the present invention, making it possible to obtain a high performance board with a small volume.

It is possible to form and use a solder resist layer in the board containing a functional element relating to the present invention shown in FIG. 10, and further to provide a plurality of conductor wiring layers and insulating resin layers on both sides of the layer containing the functional element as the core board, creating a high-functional multilayer wiring board.

Example 8

Figure 11:
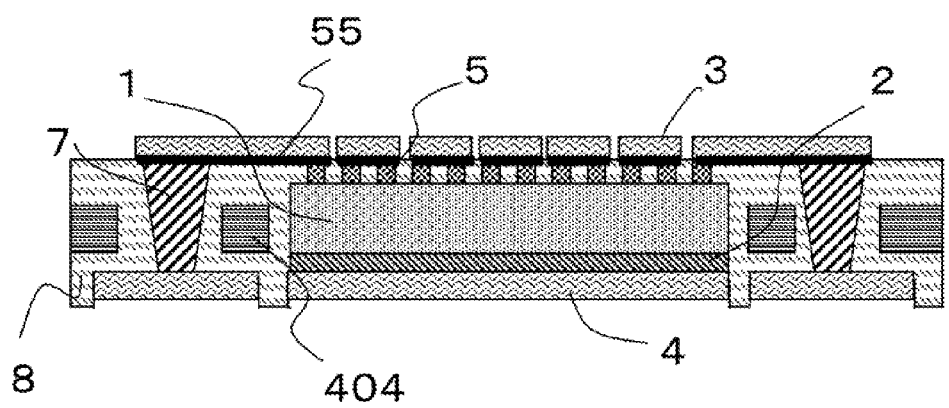
FIG. 11 shows a schematic cross section of a wiring board having an intermediate layer relating to Example 8 of the present invention.

FIG. 11 shows an eighth example of the present invention. FIG. 11 shows a wiring board structure containing a functional element and having the organic insulating resin layer 8 as the basic material in which intermediate layers 404 made of metal or ceramic are provided sideward of the functional element 1. Above and below the functional element 1, one layer each of the conductor wiring layers 3 and 4 is formed. The electrode terminal 5 of the functional element and the conductor wiring layer 3 are wired to each other via the seed layer 55 as shown in FIG. 2A or 2B. The metal via 7 and the conductor wiring layer 3 are wired as shown in FIG. 1A or 1B, and the sides of the metal via 7 and the insulating resin layer 8 are attached to each other as shown in FIG. 1A or 1B. The surface of the functional element 1 opposite to the side where the electrode terminals 5 are arranged is joined to the conductor wiring layer 4 via the adhesion layer 2. The height of the conductor wiring layer 4 is the same level as or lower than the surface of the insulating resin layer 8, and although the sides of the conductor wiring layer 4 are covered with the insulating resin layer 8, the surface of the conductor wiring layer 4 is not covered by the insulating resin layer 8.

The intermediate layer 404 strengthens the board and is able to increase the reliability of the product. Here, a stainless SUS304 or Kovar Alloy sheet having a thickness of 0.05 mm to 0.3 mm was used corresponding to the thickness of the embedded functional element 1. By wiring the conductor wiring layers 3 and 4 to this intermediate layer via a Cu plating via (not shown in the drawing), the intermediate layer could be used as a ground layer and excellent electrical characteristics could be obtained. Further, when the functional element 1 has a high heat generation, by using a metal intermediate layer, a functional element-embedded board having excellent heat dissipating characteristics can be provided. Further, when the intermediate layer 404 was formed with a ceramic board made of $SiO_2$, $Al_2O_3$, etc., by forming a plurality of conductor wiring layers inside the ceramic board, a functional element-embedded board having even more layers could be obtained.

By wiring between the electrode terminal 5 of the functional element 1 and the conductor wiring layer 3 as in the second example shown in FIG. 2A or 2B, it becomes possible to further increase the connection positioning accuracy between the wirings and the structural product reliability. It is possible to form and use a solder resist layer in the board containing a functional element shown in FIG. 11, and to provide a plurality of conductor wiring layers and insulating resin layers on both sides of the layer containing the functional element as the core board using a subtractive method at a low cost, creating a high-functional multilayer wiring board.

Example 9

Figure 12:
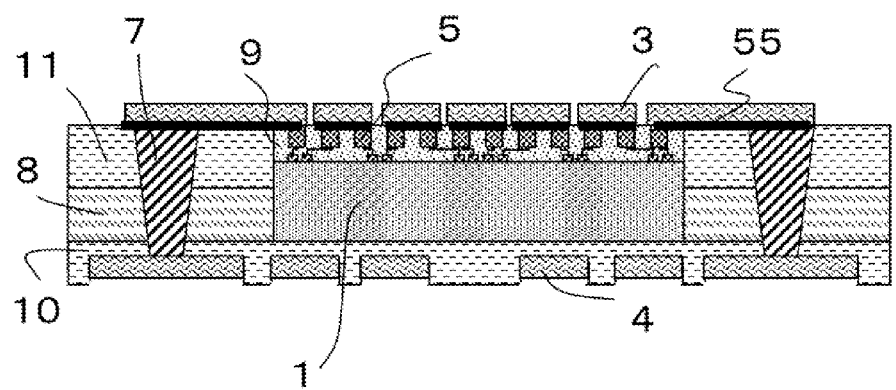
FIG. 12 shows a schematic cross section of a wiring board relating to Example 9 of the present invention without any adhesion layer for a functional element.

FIG. 12 is a ninth example relating to the present invention, and shows the structure of a functional element-embedded wiring board having the organic (insulating) resin layers 8, 10, and 11 as the basic materials. Above and below the functional element 1, one layer each of the conductor wiring layers 3 and 4 is formed. The electrode terminal 5 of the functional element and the conductor wiring layer 3 are wired to each other via the seed layer 55 as shown in FIG. 2A or 2B. The metal via 7 and the conductor wiring layer 3 are wired as shown in FIG. 1A or 1B, and the sides of the metal via 7 and the insulating resin layer 8 are attached to each other as shown in FIG. 1A or 1B. The conductor wiring layers 3 and 4 above and below are wired to each other via the metal via 7 having the inside of the via filled with metal plating or a conductor paste. The surface of the functional element 1 opposite to the side where the electrode terminals 5 are arranged is directly joined to the insulating resin layer 10 provided immediately above the conductor wiring layer 4. Further, the height of the conductor wiring layer 4 is entirely the same level as or lower than the surface of the insulating resin layer 10, and although the sides of the conductor wiring layer 4 are covered with the insulating resin layer 10, the surface of the conductor wiring layer 4 is not covered by the insulating resin layer 10.

In the structure shown in FIG. 12, the functional element 1 is jointed to the insulating resin layer 10 without using the adhesion layer 2, compared to FIG. 3B in which the functional element 1 is jointed to the insulating resin layer 10 via the adhesion layer 2. Since the insulating resin layer 10 itself is resin, by press-mounting the surface of the functional element 1 opposite to the electrode terminal 5 directly to the insulating resin layer 10 in a semi-cured state before a completely cured state while applying heat to the insulating resin layer 10, the functional element 1 can be attached to the insulating resin layer 10 because the fluidity of the insulating resin layer 10 increases due to the applied heat. As a result, it is not necessary to provide the adhesion layer 2 having a thickness of approximately 2 to 40 μm; therefore the functional element-embedded board can be made thinner. Further, when the embedded functional element 1 has a low heat generation during operation, conductor wiring patterns can be formed on both surfaces of the board immediately above and below the functional element 1 by providing the insulating resin layer 10 between the functional element 1 and the conductor wiring layer 4.

Electronic parts can be surface-mounted on and semiconductor device can be flip-chip connected to these conductor wiring patterns; therefore the board area can be effectively used for mounting parts. This contributes to reducing the area of the board and the size of the product. Further, all the vias are tapered in the same direction and are disposed so that the inner diameter becomes smaller towards the surface of the conductor wiring layer 4 and becomes larger towards the opposite surface.

Further, in FIG. 12, the electrode terminals 5 are provided on a surface (the active surface) of the functional element 1, and the electrode pitch between the functional element and the conductor wiring layer 3 is adjusted. Cylindrical columns made of copper called copper posts, or one or more conductor wiring layers formed inside the insulating resin layer 9 in advance are preferably used, however, the shape and material are not limited thereto. Further, when these electrode terminals are exposed on the surface, the mounting accuracy is improved since the alignment marks for mounting elements can be clearly seen. On the other hand, when the electrode terminals are buried under the insulating resin layer 9, the surface is protected and the workability when mounting the functional element is improved.

"PIMEL" manufactured by Hitachi Chemical Co., Ltd, and "BCB" manufactured by the Dow Chemical Company were used for the insulating resin layer 9, however, the material is not limited thereto. Further, when the functional element is embedded inside the resin, the circuit board structure according to the present invention may be used without forming the insulating resin layer 9 on the functional element in order to reduce costs.

Example 10

Figure 13:
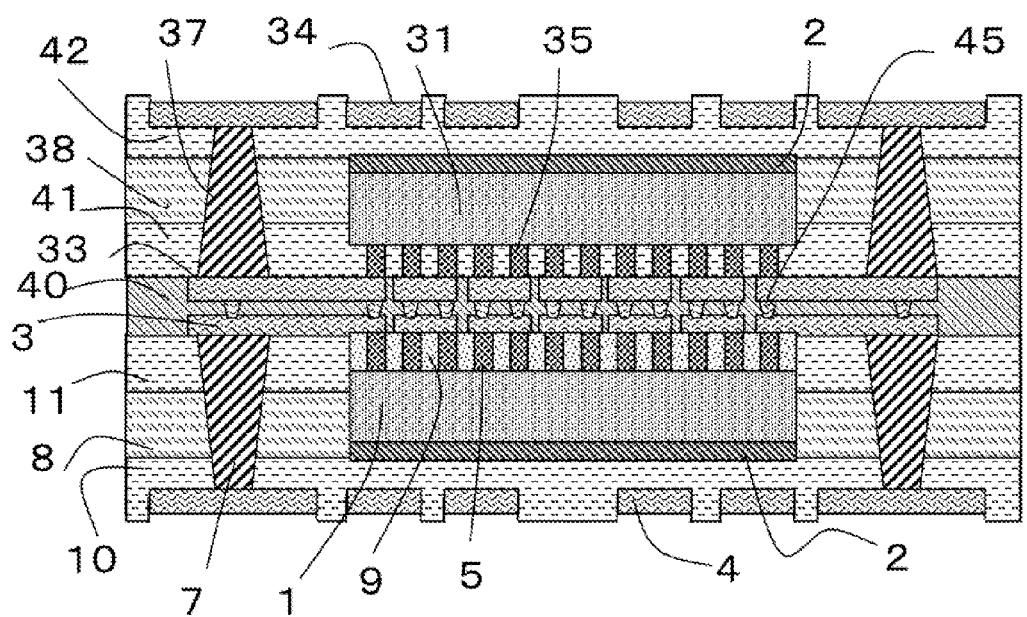
FIG. 13 shows a schematic cross section of a wiring board, in which two wiring boards are stacked, relating to Example 10 of the present invention.
Figure 14:
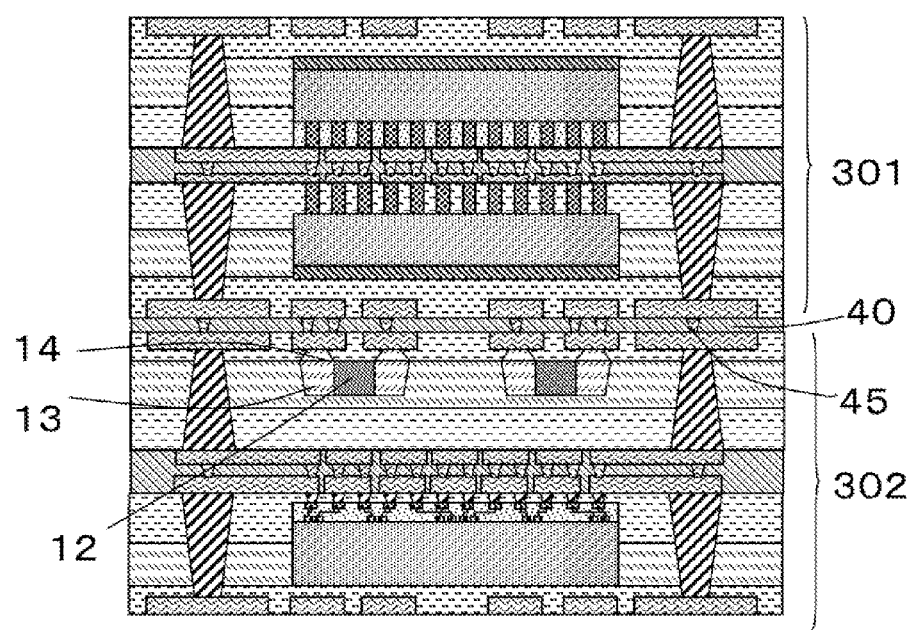
FIG. 14 shows a schematic cross section of the wiring hoard, in which more boards are stacked, relating to Example 10 of the present invention.

FIGS. 13 and 14 show a tenth example of the present invention. FIG. 13 is a cross section of a wiring board containing a plurality of functional elements in which functional elements are vertically stacked by making an insulating connection between wiring boards each containing functional elements 1 and 31 respectively using an adhesion layer 40, and a conductive connection using vias 45 filled with a conductor paste.

The adhesion layer 40 based on epoxy, polyimide, or liquid crystal polymer is suitably used without being limited thereto. Further, for the purposes of increasing the strength and improving the high-speed transmission performance, aramid non-woven fabric, aramid film, glass cloth, and silica film can be suitably contained inside the adhesion layer 40, however, the material contained in the insulating resin layer is not limited thereto. In the present example, epoxy resin containing glass cloth normally called prepreg material, or epoxy resin containing aramid non-woven fabric, each having a thickness of 20 to 80 μm, was used for the adhesion layer 40. Further, the conductor paste used in the present example contains a powder made of elements such as Sn, Ag, Bi, and Cu, and the composition formula was determined according to the temperature during the manufacturing process. Further, the powder particle diameter was set to 10 μm or less when the inner diameter of the via 45 is not greater than 100 μm.

When the electrode terminal surfaces of embedded functional elements face each other as in the case of the functional elements 1 and 31, it is possible to obtain an electrical connection between the functional elements with the shortest distance and create a functional element-embedded circuit board having excellent high-speed electrical characteristics.

Since conductor wiring surfaces having uniform height positions are exposed on both surfaces of the board in the structure shown in FIG. 13 due to a manufacturing method according to the present invention, it is possible to keep the distance between an LSI and the conductor wiring of the circuit board constant when the circuit board is used for semiconductor flip-chip connection and realize reliable connections.

The conductor wiring layers 4 and 34 disposed on the upper and lower surfaces of the board have their surfaces exposed at lower levels than insulating resin layers 42 and 10 surrounding these wiring layers; therefore it is not necessary to form a solder resist layer when BGA balls or other devices are connected to the surfaces using a solder metal later on resulting in a product at a low cost.

As shown in FIG. 13, functional element-embedded boards relating to the present invention are connected to each other in the present example, however, it is possible to form a functional element-embedded board relating to the present invention by connecting multilayer wiring boards different from the functional element-embedded board via an insulating connection by the adhesion layer 40 and a conductive connection by the via 45 using a conductor paste.

The outer sizes of the two boards including the functional element-embedded boards connected by bonding may be different, making it possible to efficiently reduce the size of the functional element-embedded board.

FIG. 14 shows a cross section of a functional element-embedded wiring board structure in which the functional element-embedded boards 301 and 302 relating to the present invention, each formed by stacking two functional elements, as shown in FIG. 13, are stacked by making an insulating connection by the adhesion layer 40 and a conductive connection by the via 45 using a conductive paste. By stacking a plurality of types of functional elements, it becomes possible to shorten the wiring length between the functional elements and realize highly and three-dimensionally integrated mounting of electronic parts, overcoming the problem that electronic parts can be surface-mounted hitherto only in the two-dimensional direction.

Example 11

Figure 15:
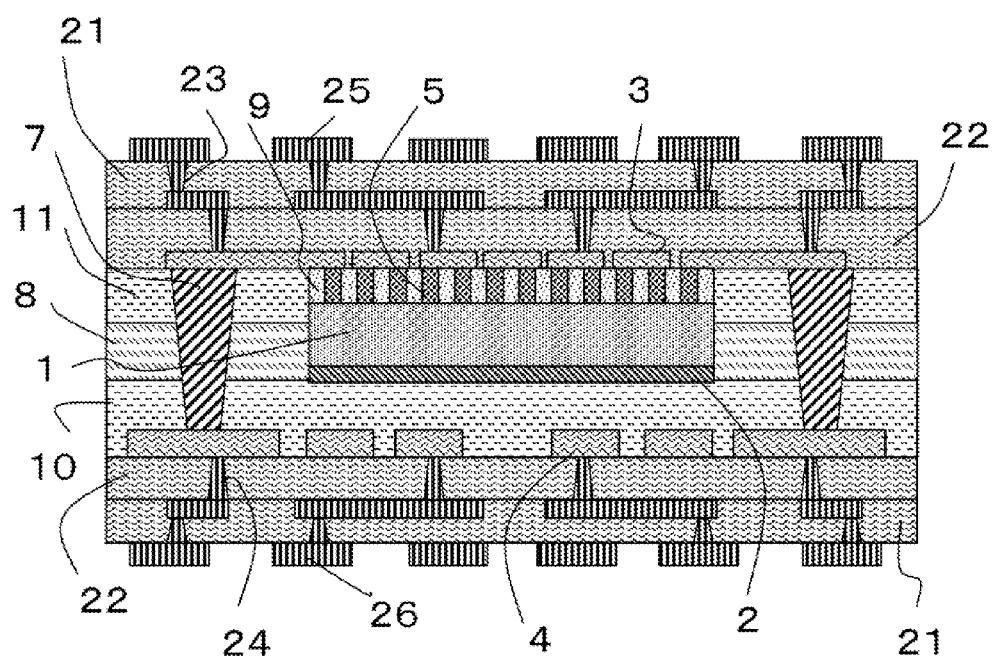
FIG. 15 shows a schematic cross section of a wiring board, in which conductor wiring layers are stacked, relating to Example 11 of the present invention.
Figure 16:
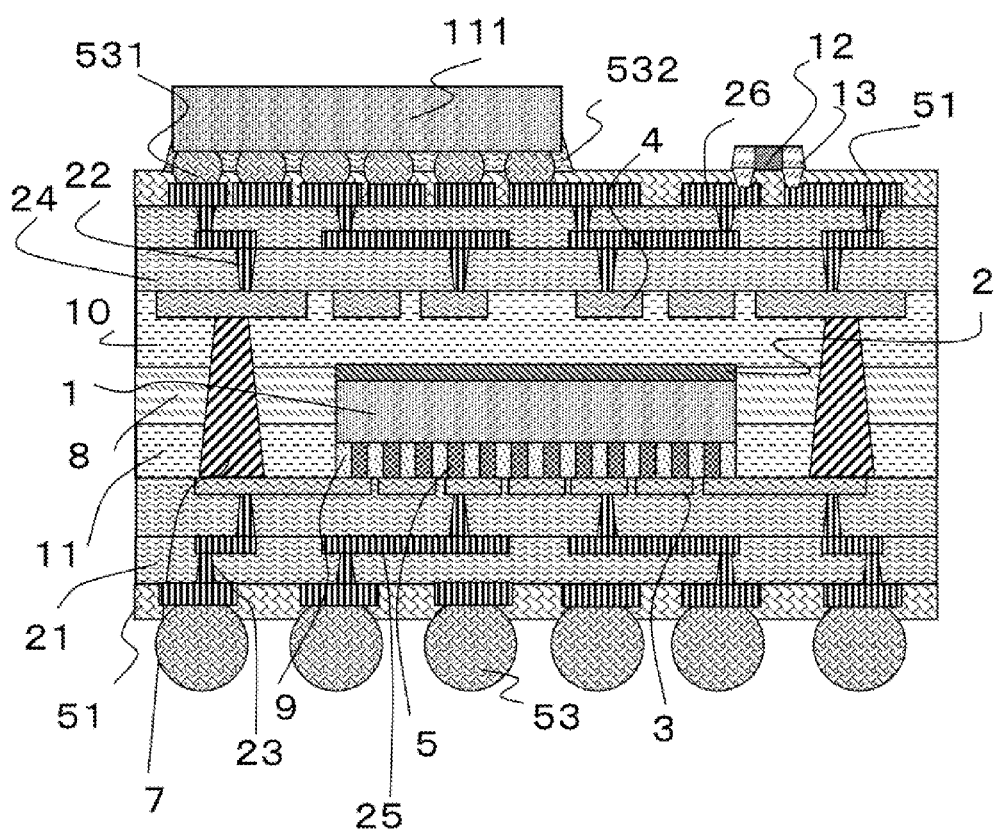
FIG. 16 shows a schematic cross section of the wiring board shown in FIG. 15, on which ball grids are mounted, relating to Example 11 of the present invention.

FIGS. 15 and 16 show an eleventh example of the present invention. FIG. 15 shows a circuit board structure in which a functional element-embedded board is used as a core board, conductor wirings 25 and 26 made of copper and having a thickness of 1 to 25 μm and insulating resin layers 21 and 22, having a thickness of 10 to 80 μm and being sandwiched between the conductive wirings 25 and 26, are respectively provided between both surfaces of the core board using a semi-additive method, and the conductor wirings are wired by conductor vias 23, 24, and so on. This structure has an effect of expanding the electrode terminal arrangement of a functional element of recent years having a fine pitch as electrode terminals get closer to the surface of the circuit board. Further, the place where the core boards containing the functional element are manufactured and the place where the wiring layers on both surfaces are built up can be different, and since there is no need to bring the equipment into the latter, manufacturing costs can be reduced.

FIG. 16 shows a package structure in which the functional element-embedded board according to the present invention shown in FIG. 15 is used, the solder balls 53 are formed at a pitch of 0.5 mm on the surface connected to a motherboard, and the electronic parts 12 such as a resistor and capacitor and the functional element 111 are connected to the opposite surface via solders 13 and 531. By wiring the functional element 1 and the functional element 111 in a short distance, it becomes possible to improve high-speed electrical characteristics. Further, by three-dimensionally disposing the functional elements, the mounting area is reduced, contributing to reducing the size of the product.

Example 1 of Manufacturing Method

Figure 17A:
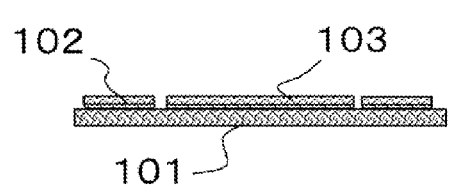
FIGS. 17A, 17B, 17C, 17D, 17E, 17F, 17G, 17H, and 17I are schematic cross sections showing a method for manufacturing a wiring board relating to Example 1 of a manufacturing method of the present invention.

FIGS. 17A to 17I show a first example of a manufacturing method according to the present invention. As shown in FIG. 17A, first a dry film and plating resist varnish are provided on a supporting plate 101 made of copper, and after performing exposure and development processing, the supporting plate 101 is plated with a first nickel wiring pattern 102 having a thickness of 0.5 to 20 μm, using a plating method. In this case, it is preferable that the material of the wiring pattern 102 be different from that of the supporting plate 101 since the wiring pattern 102 should be insoluble in the etchant when the supporting plate 101 made of metal such as Cu or stainless is removed by etching. Further, since the metal of the wiring pattern 102 will be exposed after the supporting plate is removed, gold and solder plating can be suitably used without being limited thereto. Moreover, the wiring pattern 102 may be comprised of several types of plating layers, instead of one.

When the method for removing the supporting plate is not a chemical etching method and the supporting plate is mechanically ground or torn off by applying stress, the wiring pattern 102 does not have to be provided. For the supporting plate, a single material or composite materials made of Si, glass, aluminum, stainless, polyimide, and epoxy are suitably used without being limited thereto. In a case where the supporting plate is not made of a conductive material, by providing a plating seed metal layer using a sputtering or electroless plating process, the wiring pattern 102 can be formed.

When the supporting plate is removed by a method other than etching, a releasing material is preferably provided inside the material of the supporting plate in advance, without being limited to this method. For instance, for a releasing material layer adhered to the board made of a single material such as glass, aluminum, stainless, polyimide, silicon, or epoxy, the "Micro Thin (MT)" (ultra-thin copper foil with a carrier) series, in which a releasing material layer is formed between two copper foils, manufactured by Mitsui Mining & Smelting Co., Ltd, or "PTFE Tape" (one side releasing tape) manufactured by Sumitomo 3M can be suitably used as the supporting plate, however, the materials are not limited thereto in the case where composite materials are used for the supporting plate.

Then, after the plating resist is peeled once (it may not be peeled), a pattern is formed by a new plating resist, a second copper wiring pattern 103 having a thickness of 5 to 20 μm is formed by a plating method, and the plating resist was peeled off. In this case, it is preferable that the wiring pattern 103 be provided on the wiring pattern 102. Since the wiring pattern 103 remains as a conductor wiring layer after the supporting plate is removed, it is possible to use gold, copper, or nickel without being limited thereto. Several layers of insulating resin layers and conductor wiring layers may be alternately formed thereafter.

Figure 17B:
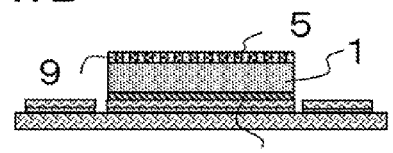

In a next step, as shown in FIG. 17B, the functional element 1 having a thickness of 10 to 725 μm is mounted on the wiring pattern 103 with the adhesion layer 2 made of organic resin and having a thickness of 10 to 30 μm interposed therebetween by applying heat and pressure. At this time, it is preferable that the wiring pattern 103 be formed such that a solid metal area is formed on an area on which the element is mounted since this area will function as a heat sink after the supporting plate is removed, however, the present method is not limited thereto.

The electrode terminals 5 of cylindrical shape or constituted by multiple-layered wirings are provided on the functional element 1 in advance. Stud bumps made of Au can also be used, and the shape of the electrode terminal 5 is not limited thereto. The electrode terminal 5 is made of Cu, Ag, or Ni, but the materials is not limited thereto. An insulating resin layer 9 may be provided when the chip active surface needs to be protected. When the insulating resin layer 9 is provided, the electrode terminal 5 of the functional element before the mounting may be buried under the insulating resin layer 9 and does not have to be exposed.

Figure 17C:
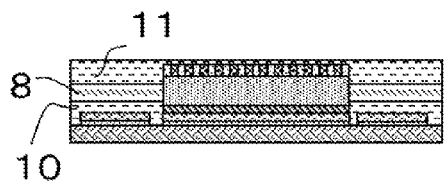

In a next step, as shown in FIG. 17C, several layers of the insulating resin layers 8, 10, and 11 are provided from the side of the electrode terminal 5 of the functional element 1 by means of vacuum press at a peak temperature of 160 to 300 degrees Celsius when the resin contains epoxy, and cured. As the method for providing the resin, a vacuum lamination method or vacuum press method is suitably used, however, it is not limited thereto. When the resin contains polyimide, after the polyimide resin was provided using a spin-coating method, the resin was cured at a peak temperature of 200 to 400 degrees Celsius. When the insulating resin layer is provided on the conductor wiring layer and the supporting plate, it is possible to increase the adhesion strength to the insulating resin layer by roughening the surfaces of the wiring layer and the supporting plate. In this case, an appropriate combination and stacking order of resin layers should be determined so that the functional element-embedded board does not bend when the supporting plate is removed.

When the insulating resin layer 8 disposed at the sides of the functional element contains a non-fluidizing substance such as glass cloth and aramid film, a space matching the outer shape of the functional element or having a width larger than that by approximately 0.1 to 1 mm in one direction is provided in the insulating resin layer 8 in advance so that the non-fluidizing substance contained in the resin does not damage the functional element during pressing. The number and type of the insulating resin layers can be suitably determined according to the thickness of the embedded functional element 1 and the thickness of the entire board, and only a single layer of the insulating resin may be provided.

Figure 17D:
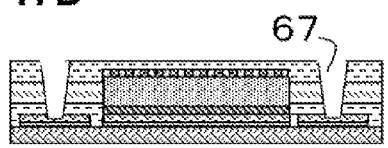

In a next step, as shown in FIG. 17D, a via hole 67 having a diameter of 20 to 800 reaching the wiring pattern 103 near the supporting plate was opened using a $CO_2$ or UV-YAG laser device. Then, by performing a desmear process using a chemical solution, resin residue inside the via hole on the wiring pattern 103 is removed and the internal resin surface of the via hole 67 is roughened. At this time, the reinforcements contained in the insulating resin layers 8, 10 and 11 such as glass cloth, silica filler, aramid non-woven fabric, and Aramika film may be exposed on the surface.

Figure 17E:
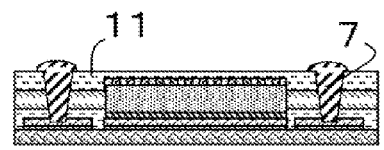

After the wiring pattern 103 of the opening is cleaned using weak acid such as dilute sulfuric acid, copper electroplating is applied using the supporting plate 101 as a feeding layer, and the metal via 7 was formed inside the via hole as shown in FIG. 17E. Instead of copper, gold or nickel can be used for the electroplating. In this case, since it is not necessary to form a plating resist layer on the insulating resin layer 11, this process can be performed at a low cost. By performing electroplating, the inside of the via hole 67 is entirely filled with plating metal to form the filled via 7. The plating metal may form a mushroom shape on the top of the via as shown in FIG. 17E.

Since the metal via 7 is formed by plating the insulating resin layer having its inner sides roughened in advance, excellent adhesion can be achieved due to an anchor effect. Further, since the plating is performed while engaging the reinforcements such as glass cloth, silica filler, aramid non-woven fabric, and Aramika film contained in the insulating resin layers 8, 10, and 11 already exposed from the resin layer surface, high joint strength between the metal via 7 and the reinforcements contained in the resin can be also achieved and the functional element-embedded board can be highly reliable against stress such as bending.

The metal via 7 may be formed by filling the hole with metal using an electroless plating method or by filling the hole with a conductor paste using a printing method, however, the method is not limited thereto. In any case, high adhesion strength can be achieved due to the anchor effect between the metal via and the insulating resin and the engagement between the via, and the resin reinforcements.

Figure 17F:
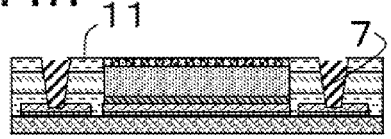
Figure 17G:
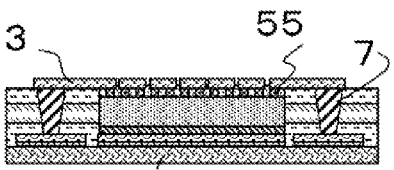

In a next step, as shown in FIG. 17F, the head of the electrode terminal 5 of the functional element 1 is exposed from the insulating resin layer 11 by grinding or using an abrasive process, and at the same time by cutting off a part of the metal via 7, disposed on the side of the functional element chip, exposed from the insulating resin layer 11, the head of the metal via 7 can be set at the same level as the surface of the insulating resin layer 11. As a result, the metal via 7, the insulating resin layer 11, and the electrode terminal 5 all essentially lie in the same plane. Next, as shown in FIG. 17G, after the wiring area is cleaned with weak acid such as dilute sulfuric acid, by sputtering, at least one conductor layer made of at least one element such as copper or nickel electroless plating, or combinations of Ti layer and Cu layer, Pd layer and Cu layer, or Cr layer and Cu layer was formed as a seed layer for a next wiring plating process. The elements constituting the seed layer were selected so that a process of forming the resistor, the inductor, and the capacitor shown in FIG. 13 would progress efficiently. After the seed layer is provided by electroless plating or sputtering, exposure is performed in order to form a plating resist when the conductor wiring layer 3 is formed, and since the entire surface area comes into focus, a fine conductor wiring layer 3 having a line width of 5 μm can be formed at high yield.

After a copper plating wiring layer having a thickness of 1 to 30 μm was formed, the plating resist was removed, and the conductor wiring layer 3 was completed by etching out non-wiring regions of the seed layer. In the present invention, by alternately forming the insulating resin layer and the conductor wiring layer on the conductor wiring layer 3 before the supporting plate is removed, a multilayer wiring connected to each other by the via on the functional element 1 can be obtained. The conductor wiring layer 3 can be formed using a printing method. In this case, since the entire surface is flat, excellent printability can be obtained and a fine wiring layer can be formed. When the mushroom-shaped head of the metal via 7 is not completely buffed, the wiring layer will not be as fine as in the case where the surface is flat, however, the reliability can be further increased since the cap of the mushroom functions as a rivet against the resin layer. When the supporting plate is used as a heat sink, the wiring board can be used as a package in the state shown in FIG. 17G and this falls within the scope of the claims of the present invention.

Figure 17H:

In a next step, as shown in FIG. 17H, when the supporting plate 101 was made of copper, the conductor wiring layer 102 made of nickel was exposed by etching using a copper etching liquid. At this time, the height of the conductor wiring layer 102 is the same as that of the insulating resin layer 10 surrounding the periphery.

Figure 17I:
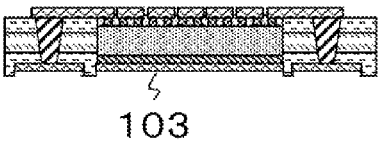

The board can be used as a wiring board as it is, however, by etching the nickel conductor wiring layer 102 using a nickel remover different from the chemical solution used for etching the supporting plate 101, the conductor wiring layer 103 made of copper can be exposed on the surface, as shown in a next step, FIG. 17I. In this case, the height of the conductor wiring layer 103 is lower than the insulating resin layer 10 surrounding the periphery by approximately 0.5 to 20 μm, and the insulating resin layer 10 can function as a solder resist layer. The conductor wiring layers 102 and 103 are wiring layers sequentially formed on the supporting plate with no resin layer provided on the surface, and it is possible to obtain a circuit board in which reliable mounting can be performed. Further, since the conductor wiring layers 102 and 103 are originally formed on the supporting plate, they have uniform heights and can be suitably used as electrode terminals for surface-mounting of a semiconductor element or BGA package with high connection reliability. The functional element-embedded circuit board obtained as above may be used as it is, however, by further forming a solder resist layer having a thickness of 5 to 30 μm and any type of opening, the board can be supplied for surface-mounting of multiple devices at the next step.

By alternately forming insulating resin layers and conductor wiring layers on both surfaces of the board in the state shown in FIG. 17H or 17I as a core board, using an additive method, semi-additive method, or subtractive method, a functional element-embedded board having a multilayer wiring could be formed as shown in FIG. 18. Moreover, the functional element-embedded board in the state shown in FIG. 17H or 17I can be diced into individual pieces, which can be embedded in other circuit boards.

It was confirmed that the conductor wiring layer 4 can be formed on a supporting plate, even when the supporting plate was made of a material other than metal, by performing a sputtering/vapor-deposition process on a seed layer made of a conductive element, as long as the supporting plate is made of a rigid material such as glass, silicon, or ceramic. Also it was confirmed that, in removing the supporting plate, the supporting plate could be removed by means other than etching, such as grinding or tearing off using a releasing material layer.

As described, even when the functional element is fragile, by employing the method in which the wiring layer and the insulating resin layer are formed on the supporting plate and the functional element is mounted on the top thereof, since the supporting plate does not get bent by the pressure of mounting and no stress is exerted on the functional element, the functional element itself can be protected from being damaged. Further, even when the insulating resin layer is provided around the periphery of the functional element by pressing or lamination thereafter, since there is the supporting plate as a base, the functional element does not get damaged and a highly reliable product can be manufactured.

Since the wiring layers can be built up above the terminals of the functional element with the supporting plate remaining attached, even in a case where the total thickness of the insulating resin layers is thin, the functional element does not get damaged by bending the board during the via processing, the plating process, and the process in which the insulating layer is provided, and excellent workability can be obtained. Moreover, it is possible to directly form a via in the wiring layer disposed below the functional element and on the supporting plate, and when the supporting plate is made of metal, plating can be applied to the inside of a via having a large aspect ratio without applying electroless plating, and the electrical reliability can be increased.

Since the supporting plate is removed in order to expose the conductor wiring on the bottom surface of the board, the areas of the conductor wiring surface where the supporting plate was can be on the same level as or lower than the resin surface, the resin surface can function as a solder resist without providing one, the conductor wirings formed on the supporting plate have the same height, and high connection reliability can be obtained in these locations when semiconductor devices are mounted. Note that the surface of the functional element does not get exposed when the supporting plate is removed, and damage to the chip during the process can be avoided.

Since the circuit board can be formed at the same time as the functional element is connected, it is possible to reduce the cost required for forming the entire package, which is the sum of the cost required for forming a conventional circuit board and the cost required for mounting a functional element. The functional elements can be three-dimensionally integrated in a circuit board at short distances to each other, making it possible to form a product having excellent high-speed transmission characteristics.

In the present invention, since the wiring is formed after the electrode terminal of the embedded functional element is exposed on the surface by grinding, the exposure and development of the plating resist pattern can be performed while directly confirming the location of the electrode terminal and the wiring can be formed with excellent positional accuracy, making it possible to form a high-specification wiring circuit.

In the formation of the metal via not directly connected to the embedded functional element, by performing desmear or ashing processing after forming the via hole using a laser device, etc., the resin residue in the bottom of the via hole and on the supporting plate can be removed and at the same time the resin surface inside the via hole can be roughened. When such means is employed, substances for increasing the reliability, such as glass cloth, aramid fiber, Aramika film, and silica resin can be mixed into the insulating resin. Further, since these mixed substances are exposed on the surface by the desmear processing, in the following step of plating the inside of the via using the supporting plate inside the via as a feeding layer, the metal via engaging the insulating resin and the substances in the insulating resin into the plating metal can be formed, it can be said that a composite material having high adhesion strength between the metal and the surrounding resin layer and the substances is formed, and high reliability can be obtained.

The metal plating inside the type 2 via hole can be made into a mushroom-shaped metal via when the plating is formed higher than the thickness of the resin by feeding from the supporting plate. In this case, since the mushroom-shaped plating metal can function as a rivet on the insulating resin as well, even higher reliability can be obtained.

By simultaneously grinding or polishing the electrode terminal (type 1 metal via) of the functional element and the type 2 via after being plated with metal, the functional element-embedded board according to the present invention exhibits excellent flatness. The surface opposite to the side of the electrode terminal of the embedded functional element also has a wiring layer formed on the supporting plate, and it is another important characteristic of the present invention that the wiring layers and the insulating layers disposed on both surfaces of the functional element-embedded board are flat after all the manufacturing steps including the step of removing the supporting plate are completed. The fact that the surfaces of the board are flat helps to improve the flatness of the product, and when a multilayer wiring is built up thereafter, excellent wiring density can be achieved.

Example 2 of Manufacturing Method

Figure 18A:
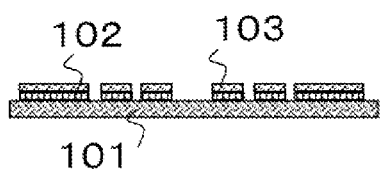
FIGS. 18A, 18B, 18C, 18D, 18E, 18F, 18G, 18H, 18I, and 18J are schematic cross sections showing a method for manufacturing a wiring board relating to Example 2 of the manufacturing method of the present invention.
Figure 18B:
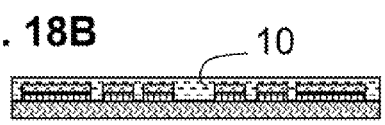

FIGS. 18A to 18J show a second example of the manufacturing method according to the present invention. As is explained in FIG. 17A, the nickel wiring layer 102 having a thickness of 2 to 20 μm and the conductor wiring layer 103 made of copper and having a thickness of 5 to 30 μm were formed on the copper supporting plate 101 having a thickness of 0.1 to 1.0 mm, using a plating method in FIG. 18A. Then, as shown in FIG. 18B, the insulating resin layer 10 having a thickness of 10 to 500 μm and containing a polyimide or epoxy component was provided using a vacuum laminator, and cured. Since the insulating resin layer 10 still exists below the functional element after the supporting plate is removed, the conductor wiring layers 102 and 103 can be large-area solid patterns aiming at a heat sink effect, or the conductor wiring layers 102 and 103 can be made into any wiring shape such as BGA pads or pads for flip-chip connection. A vacuum laminator, vacuum press, roll coater, spin-coating device, and curtain coating device can be suitably used for providing the resin layer without being limited thereto.

Figure 18C:
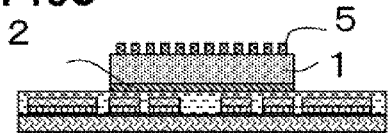

In a next step, the functional element 1 having silicon as the basic material was joined to the insulating resin layer 10 with the adhesion layer 2 made of an epoxy die attachment film and having a thickness of 10 to 30 μm interposed therebetween as shown in FIG. 18C. The insulating resin layer 10 may be cured immediately after the step in FIG. 18B, however, the functional element chip can be mounted without using the adhesion layer 2 if the functional element 1 is mounted on a half-cured insulating resin layer 10.

Figure 18D:
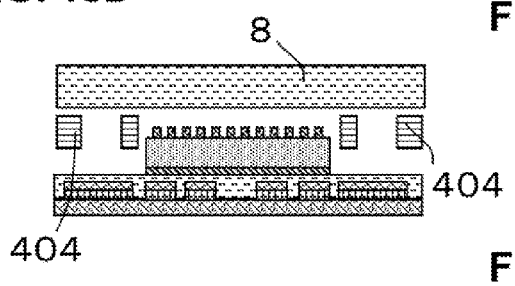
Figure 18E:
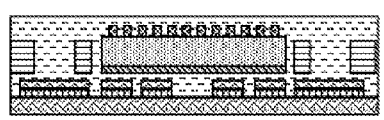

Then, as shown in FIG. 18D, the insulating resin layer 8 and the intermediate layer 404 made of metal or ceramic are provided using a vacuum laminator or vacuum press, and the periphery of the functional element 1 is sealed with the resin as shown in FIG. 18E. At this time, at least one type of the insulating resin layer can be used, and in terms of the reliability of the product and workability during the manufacturing process, it is preferable that the board be designed so that the present circuit board bends as little as possible after the supporting plate is removed, and that the insulating layers be disposed, taking their adhesion to the material of the functional element into consideration.

When the insulating resin layer 8 disposed at the sides of the functional element contains a non-fluidizing substance such as glass cloth and aramid film, a space matching the outer shape of the functional element or having a width larger than that by approximately 0.1 to 1 mm in one direction is provided in the insulating resin layer 8 in advance so that the non-fluidizing substance contained in the resin does not damage the functional element during pressing.

The intermediate layer 404 made of metal such as SUS340 or ceramic prevents the board from bending and increases its rigidity when the board is thin. Since laser processing is performed in a later step in order to form the via hole 67 for wiring between the conductor wiring layer 103 and the conductor wiring layer 3, an opening larger than the outer shape of the via hole 67 was formed at a desired position on the intermediate layer 404 by means of chemical etching in advance, and another opening matching or larger than the outer shape of the functional element 1 was formed on the area where the functional element 1 would be.

Figure 18F:
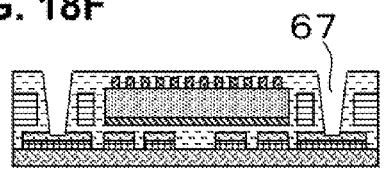

In a next step, as shown in FIG. 18F, the via hole 67 having a diameter of 50 to 800 μm was formed on the conductor wiring layer 103 near the supporting plate using such as a $CO_2$ or UV-YAG laser device. Then, by performing desmear process using a chemical solution, resin residue inside the via hole on the conductor wiring pattern 103 was removed and the internal resin surface of the via hole 67 was roughened. At this time, the reinforcements contained in the insulating resin layers 8 and 10 such as glass cloth, silica filler, aramid non-woven fabric, and Aramika film may be exposed on the surface.

In a following step, by applying copper electroplating as in FIG. 17E, the metal via 7 was formed inside the via hole. At this time, since it is not necessary to form a plating resist layer on the insulating resin layer 11, this process can be performed at a low cost. By performing electroplating, the inside of the via hole 67 becomes the filled via 7 entirely filled with plating metal, and plating metal may form a mushroom shape on the top of the via as shown in FIG. 17E.

Since the metal via 7 is plated on the insulating resin layer having its inner sides roughened in advance, excellent adhesion can be achieved due to an anchor effect. Further, since the plating is performed while engaging the reinforcements such as glass cloth, silica filler, aramid non-woven fabric, and Aramika film contained in the insulating resin layers 8 and 10 already exposed from the resin layer surface as shown in FIG. 1, high joint strength between the metal via 7 and the reinforcements contained in the resin could be achieved and the functional element-embedded board was highly reliable against stress such as bending. The metal via 7 may be formed by filling the hole with metal using an electroless plating method or by filling the hole with a conductor paste using a printing method, however, the method is not limited thereto. High adhesion strength can be achieved due to the anchor effect between the metal via and the insulating resin, and the connection between the via and the resin reinforcements.

Figure 18G:
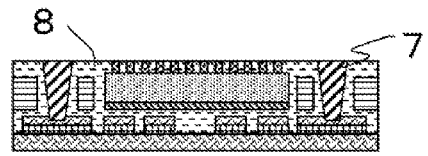
Figure 18H:
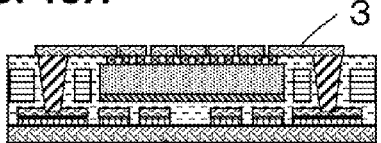

In a next step, as shown in FIG. 18G, the head of the electrode terminal 5 of the functional element 1 is exposed from the insulating resin layer 8 by using a grinding method, and by cutting off a part of the metal via 7, disposed on the side of the functional element chip, exposed from the surrounding insulating resin layer 8 at the same time, the head of the metal via 7 could be at the same level as the surface of the insulating resin layer 8. As a result, the metal via 7, the insulating resin layer 8, and the electrode terminal 5 all lie in the same plane with a flatness deviation of not greater than plus or minus 5 μm, discounting the warpage of the board itself, and after the seed layer is provided by electroless plating or sputtering in a next step in FIG. 18H, exposure is performed in order to form a plating resist when the conductor wiring layer 3 is formed, and a fine conductor wiring layer 3 can be formed at high yield since the entire surface area comes into focus.

The plating resist is removed using alcohol after the plating, and the conductor wiring layer 3 is completed by etching out non-wiring regions of the seed layer using acid. The conductor wiring layer 3 can be formed using a printing method. In this case, since the entire surface is flat, excellent printability can be obtained and a fine wiring layer can be formed. When the mushroom-shaped head of the metal via 7 is not completely buffed, the wiring layer will not be as fine as in the case where the surface is flat, however, the reliability can be further increased since the cap of the mushroom functions as a rivet against the resin layer. When the supporting plate is used as a heat sink, the wiring board can be used as a package in the state shown in FIG. 18H and this falls within the scope of the claims of the present invention.

Figure 18I:
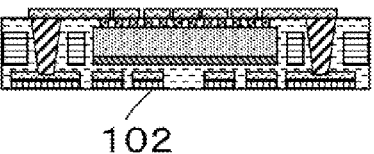
Figure 18J:
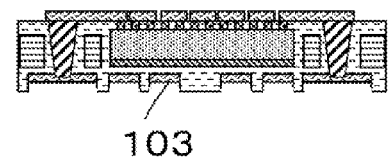

The following steps are the same as those in FIGS. 17H and 17I: the copper supporting plate 101 is removed in FIG. 18I, and the conductor wiring layer 103 is exposed on the surface in FIG. 18J. The functional element-embedded circuit board obtained as above may be used as it is, however, by further forming a solder resist layer having a thickness of 5 to 30 μm and any type of opening, the board can be supplied for surface-mounting of multiple devices. At this time, the solder resist layer can be formed on only one surface. Further, insulating resin layers and conductor wiring layers could be alternately formed on both surfaces of the board in the state shown in FIG. 18I or 18J as a core board, using an additive method, semi-additive method, or subtractive method.

Example 3 of Manufacturing Method

Figure 19A:
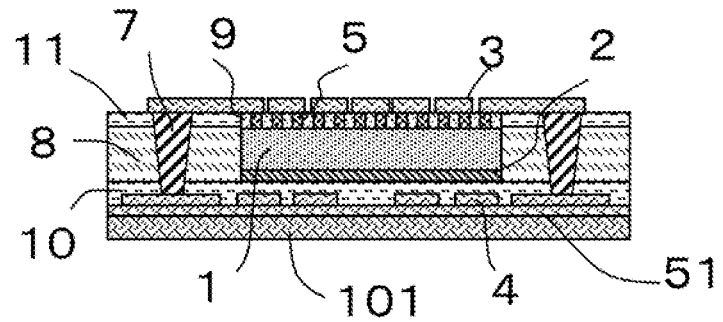
FIGS. 19A, 19B, 19C, and 19D are schematic cross sections showing a method for manufacturing a wiring board relating to Example 3 of the manufacturing method of the present invention.

FIGS. 19A to 19D show a third example of the manufacturing method according to the present invention. As shown in FIG. 19A, an epoxy resin layer having a thickness of 5 to 30 μm is provide as the insulating layer 51, which will be a solder resist, on the glass supporting plate 101 in advance, and after applying electroless copper plating to the layer above it, the conductor wiring layer 4 made of copper and having a thickness of 5 to 30 μm is formed. Then, the plating resist is removed, and the non-wiring regions of the electroless copper plating are etched out.

As in the following steps in FIGS. 18C to 18H, after the insulating resin layer 10 was provided and the functional element 1, on which the electrode terminal 5 was formed, was mounted, the periphery of the functional element 1 was sealed with resin by the insulating resin layers 8 and 11, and the functional element 1 and the circuit board according to the present invention were electrically connected by connecting the conductor wiring layers 3 an 4 via the metal via 7.

Figure 19B:
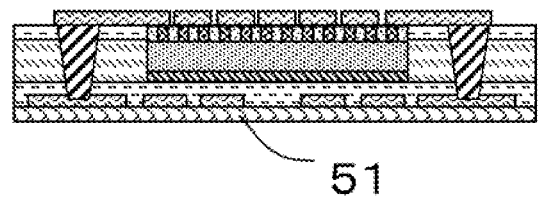

In a next step, as shown in FIG. 19B, by removing the glass supporting plate 101 using a chemical solution or by grinding, the insulating resin layer 51 is exposed on the surface and is given a function as a solder resist by forming vias (openings) 52 in regions corresponding to the positions of the electrode terminals of parts mounted on the circuit board, using a laser device, and so on. Further, the solder resist layer 51 having vias formed therein and a thickness of 5 to 30 μm is formed on the opposite surface.

Figure 19C:
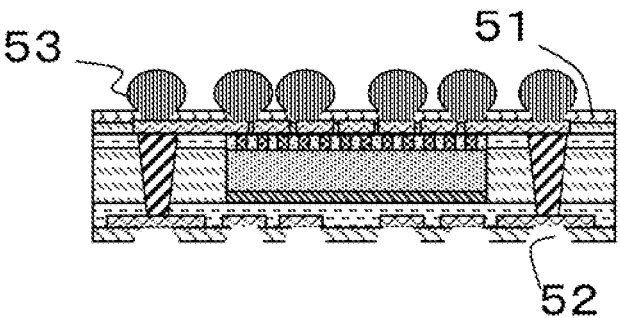
Figure 19D:
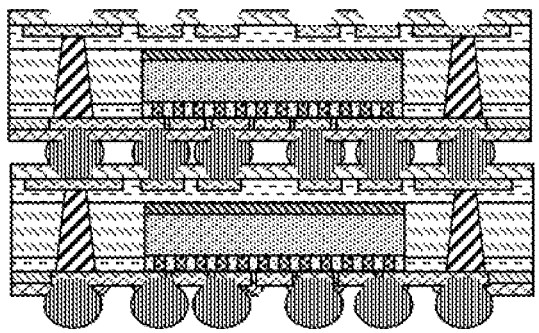

Next, as shown in FIG. 19C, the solder balls 53 are mounted on the openings of the solder resist on one of the surfaces, and with such a functional element-embedded board with solder balls as one package, by stacking and reflowing a plurality of the packages for a step in FIG. 19D after conducting an electrical inspection on each package, it becomes possible to stack two or more functional element-embedded boards. Comparing to a case where a plurality of types and numbers of functional elements are embedded in a board, the total volume becomes larger in the case where a plurality of boards having one functional element embedded therein are stacked, however, an electrical inspection can be conducted on each functional element-embedded board in the middle of the manufacturing process and the product yield can be improved.

Example 4 of Manufacturing Method

Figure 20:
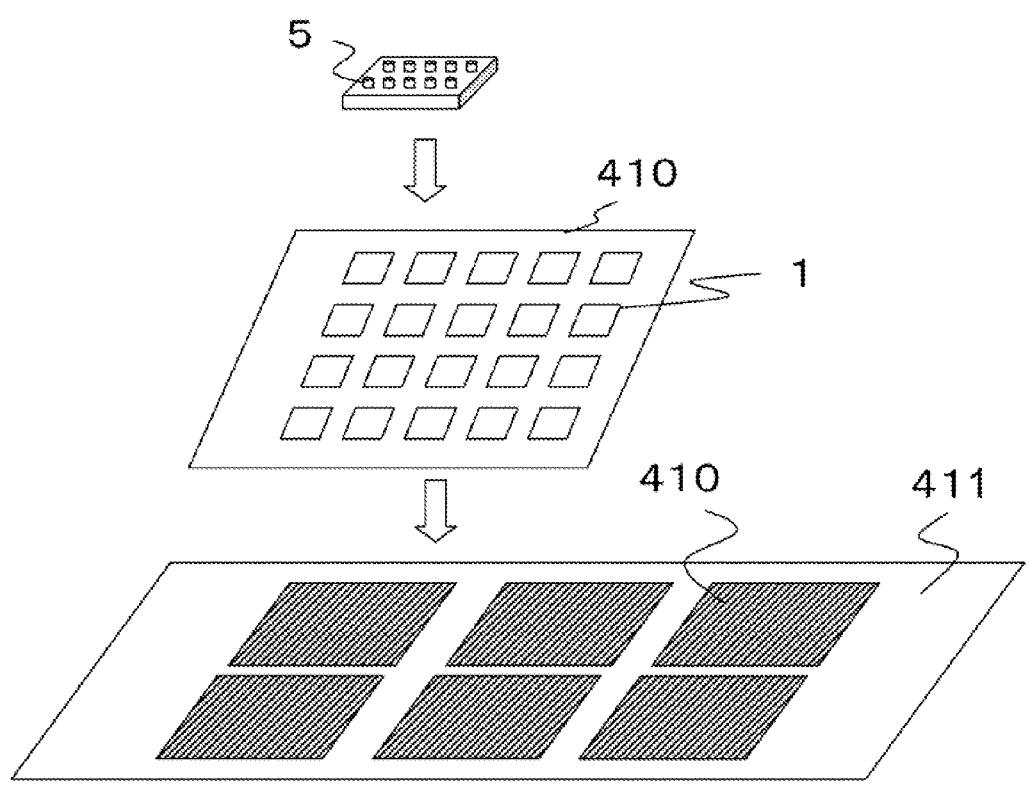
FIG. 20 is a schematic cross section showing a method for manufacturing a wiring board relating to Example 4 of the manufacturing method of the present invention.

FIG. 20 shows a fourth example of the manufacturing method according to the present invention. By using a functional element-embedded board 410 relating to the present invention and having the functional element 1 basically made of a Si material embedded therein and further embedding a plurality of the functional element-embedded boards according to the present invention in a large board 411, one or more copper wiring layers and insulating layers are provided on one or both surfaces with the functional element-embedded board 410 as a core layer. At this time, by designing so that the wiring layer having the terminal pitch expanded and wired to each electrode terminal 5 of the functional element 1 is provided on the surface of the functional element-embedded board 410, the functional element-embedded board 410 can easily have an electrical inspection conducted thereon before being embedded in the large board 411. Further, by only embedding functional element-embedded boards 410 having a diameter of 8 inches and passing the electrical inspection in the large board 411 having a size of 500 mm by 600 mm, it becomes possible to increase the product yield and reduce manufacturing costs due to the processing using the large board.

The functional element-embedded board 410 is formed using a semi-additive method capable of forming a fine wiring pattern since the wiring layer is directly wired from the electrode terminal 5 of the embedded functional element 1, however, when it is possible to form a wiring using a low cost subtractive method, without the need to form a fine wiring, in the wiring process for the large board 411 having a size of 500 mm by 600 mm, dividing the manufacturing process into two places makes the operation more efficient and makes mass production with high yield and at a low cost possible.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

EXPLANATION OF SYMBOLS

1: functional element
2: adhesion layer
3: (first) conductor wiring layer
4: (second) conductor wiring layer
5: electrode terminal (type 1 via)
7: type 2 metal via
8, 9, 10, 11: insulating resin layer
12: electronic part
13: lead-free solder
14: conductor via
15: electrode pad
21, 22: insulating resin layer
23, 24 conductor via
25, 26, 33: conductor wiring
31: functional element
32: conductor wiring layer
34: conductor wiring layer
35: electrode terminal
38: insulating resin layer
40: adhesion layer (insulating resin layer)
41: conductor wiring layer
42: insulating resin layer
45: solder or conductor paste via
51: solder resist layer
52: opening of solder resist layer
53: solder ball
55: (plating) seed layer
67: via hole
71: conductor via
81: glass cloth
82: silica filler
83: insulating resin layer
101: supporting plate
102, 103: wiring pattern (conductor wiring layer)
111: functional element
151, 152: conductor via
301, 302: wiring board containing functional element
401: resistor
402: dielectric
403: inductor
404: intermediate layer made of metal or ceramic
410: board containing functional element
411: large board
501: tapered electrode terminal
531: solder ball
532: under-fill resin

What is claimed is:

1. A wiring board, constituted by stacking at least one conductor wiring layer and at least one insulating resin layer, comprising:
   at least one metal via penetrating the insulating resin layer;
   at least one functional element inside said insulating resin layer, wherein;
   the insulating resin layer includes a reinforcing component, and
   a boundary surface between the metal via and the insulating resin layer has a strengthened structure in which the metal via internally engages the reinforcing component,
   wherein the reinforcing component includes at least one of a particulate reinforcement and a fibrous reinforcement,
   wherein at least one electrode terminal is formed on an active surface of said functional element embedded, and a first conductor wiring layer disposed nearest to the active surface of the functional element and the active surface of the functional element are wired to each other via the electrode terminal,
   wherein a second conductor wiring layer disposed on the outermost surface of said wiring board opposite to the active surface of said functional element is covered with said insulating resin except for a wiring surface of the second conductor wiring layer,
   wherein said first conductor wiring layer and said second conductor wiring layer are wired to each other via said metal via disposed away from said functional element,
   wherein said metal via does not have any plating seed layer on a boundary surface with insulating resin in contact with a side of the metal via and on a boundary surface with said second conductor wiring layer, and has a plating seed layer on a boundary surface with said first conductor wiring layer.

2. The wiring board as defined in claim 1, wherein, in an area where said metal via is wired to said first conductor wiring layer, the metal via is formed like a mushroom having a lampshade-shaped portion the center of which is thicker than the periphery and the top of which is protruding outwardly, and is formed like a rivet having inner diameter larger on the boundary surface with the first conductor wiring layer than on the boundary surface with said second conductor wiring layer.

* * * * *